United States Patent
Hishiki et al.

(10) Patent No.: US 7,871,871 B2
(45) Date of Patent: Jan. 18, 2011

(54) MANUFACTURING METHOD FOR SEMICONDUCTOR INTEGRATED CIRCUIT DEVICE

(75) Inventors: Masanobu Hishiki, Tokyo (JP); Yaichiro Miura, Tokyo (JP); Hiroshi Kawashima, Tokyo (JP); Katsuhiro Mitsuda, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 136 days.

(21) Appl. No.: 12/393,087

(22) Filed: Feb. 26, 2009

(65) Prior Publication Data
US 2009/0221105 A1    Sep. 3, 2009

(30) Foreign Application Priority Data
Feb. 28, 2008    (JP) .............................. 2008-047400

(51) Int. Cl.
*H01L 21/66* (2006.01)
(52) U.S. Cl. ..................... 438/153; 438/154; 438/199; 438/200; 257/E21.53; 257/E21.632
(58) Field of Classification Search ......... 438/153–154, 438/197–200; 257/E21.53, E21.632
See application file for complete search history.

(56) References Cited

U.S. PATENT DOCUMENTS 6,387,735 B1    5/2002    Ueda
6,974,737 B2 *  12/2005   Snyder et al. ............... 438/199
7,230,302 B2 *   6/2007   Lotfi et al. .................. 257/369
2006/0183290 A1  8/2006   Kamada et al.
2009/0291540 A1* 11/2009  Zhang et al. ................ 438/229
2009/0305471 A1* 12/2009  Chang et al. ............... 438/154

FOREIGN PATENT DOCUMENTS

| JP | 2001-196580 A | 7/2001 |
| JP | 2001-332723 A | 11/2001 |
| JP | 2006-190795 A | 7/2006 |

* cited by examiner

*Primary Examiner*—Thanh Nguyen
(74) *Attorney, Agent, or Firm*—Miles & Stockbridge P.C.

(57) ABSTRACT

In mass production of CMIS integrated circuit devices or the like, electric characteristics, such as Vth (threshold voltage) or the like, disadvantageously vary due to variations in gate length of the MISFET. This problem has become serious because of a short channel effect. In order to solve the problem, various kinds of feed-forward techniques have been studied in which a subsequent variation factor process is regulated to be reversed with respect to variations in a previous variation factor process so as to cause these variation factors to cancel each other out. Since the feed-back technique has an effect of the cancellation process over the entire system, the technique can be relatively easily applied to a product with a single type of MISFE, but is difficult to be applied to a product equipped with a plurality of types of MISFETs. The invention is adapted to adjust the amount of halo implantation by multivariate analysis based on the result of a patterning step of the gate electrode and a film forming step of an offset spacer.

20 Claims, 36 Drawing Sheets

Fig.35

N-ch FET CORRECTION TABLE

OFFSET SPACER THICKNESS (nm)

| GATE LENGTH (nm) | 12.7 | 12.8 | 12.9 | 13.0 | 13.1 | 13.2 | 13.3 |
|---|---|---|---|---|---|---|---|
| 51 | 3.99 | 3.98 | 3.96 | 3.95 | 3.94 | 3.92 | 3.91 |
| 52 | 3.95 | 3.93 | 3.92 | 3.91 | 3.89 | 3.88 | 3.87 |
| 53 | 3.90 | 3.89 | 3.88 | 3.86 | 3.85 | 3.84 | 3.83 |
| 54 | 3.87 | 3.86 | 3.84 | 3.83 | 3.82 | 3.81 | 3.80 |
| 55 | 3.83 | 3.82 | 3.81 | 3.80 | 3.79 | 3.78 | 3.77 |
| 56 | 3.80 | 3.79 | 3.78 | 3.77 | 3.76 | 3.75 | 3.74 |
| 57 | 3.76 | 3.75 | 3.74 | 3.73 | 3.72 | 3.71 | 3.70 |
| 58 | 3.73 | 3.72 | 3.71 | 3.70 | 3.69 | 3.68 | 3.68 |
| 59 | 3.72 | 3.71 | 3.70 | 3.69 | 3.69 | 3.68 | 3.67 |

DOSE AMOUNT IN P-HALO IMPLANTATION ($10^{13} cm^{-2}$)

Fig.36

P-ch FET CORRECTION TABLE

OFFSET SPACER THICKNESS (nm)

| | 12.7 | 12.8 | 12.9 | 13.0 | 13.1 | 13.2 | 13.3 |
|---|---|---|---|---|---|---|---|
| 51 | 3.66 | 3.65 | 3.63 | 3.62 | 3.60 | 3.59 | 3.57 |
| 52 | 3.63 | 3.62 | 3.60 | 3.59 | 3.57 | 3.56 | 3.54 |
| 53 | 3.60 | 3.59 | 3.57 | 3.56 | 3.54 | 3.53 | 3.52 |
| 54 | 3.57 | 3.56 | 3.54 | 3.53 | 3.52 | 3.50 | 3.49 |
| 55 | 3.54 | 3.53 | 3.51 | 3.50 | 3.49 | 3.47 | 3.46 |
| 56 | 3.53 | 3.51 | 3.50 | 3.49 | 3.47 | 3.46 | 3.45 |
| 57 | 3.52 | 3.51 | 3.50 | 3.48 | 3.47 | 3.46 | 3.44 |
| 58 | 3.52 | 3.51 | 3.49 | 3.48 | 3.47 | 3.46 | 3.44 |
| 59 | 3.52 | 3.50 | 3.49 | 3.48 | 3.47 | 3.45 | 3.44 |

GATE LENGTH (nm)

DOSE AMOUNT IN N-HALO IMPLANTATION ($10^{13} cm^{-2}$)

US 7,871,871 B2

MANUFACTURING METHOD FOR SEMICONDUCTOR INTEGRATED CIRCUIT DEVICE

CLAIM OF PRIORITY

The present application claims priority from Japanese application JP 2008-47400 filed on Feb. 28, 2008, the content of which is hereby incorporated by reference into this application.

FIELD OF THE INVENTION

The present invention relates to techniques effectively applied to a threshold-voltage (Vth) control technique in a manufacturing method for a semiconductor integrated circuit device (or a semiconductor device).

BACKGROUND OF THE INVENTION

Japanese Unexamined Patent Publication No. 2001-196580 (Patent Document 1) or U.S. Pat. No. 6,387,735 (Patent Document 2) discloses a technique for regulating a dose amount in ion implantation into a heavily doped source/drain region, as a characteristic control method for controlling characteristics of a short-channel metal-insulator-semiconductor field-effect transistor (MISFET) due to variations in gate length or the like. The patent document suggests that the technique is easily controlled as compared to the control performed in halo implantation or the like.

Japanese Unexamined Patent Publication No. 2006-190795 (Patent Document 3) or U.S. Patent Laid-Open No. 2006-0183290 (Patent Document 4) discloses a technique for regulating the temperature distribution in annealing after ion implantation into a heavily doped source/drain region, as the characteristic control method for controlling characteristics of the short-channel MISFET due to variations in gate length or the like.

Japanese Unexamined Patent Publication No. 2001-332723 (Patent Document 5) discloses a technique for manufacturing a semiconductor integrated circuit device which has small variations in electric characteristics, such as Vth or the like, by measuring Vth in a previous step, and performing feed-forward control for a subsequent coating step.

[Patent Document 1] Japanese Unexamined Patent Publication No. 2001-196580

[Patent Document 2] U.S. Pat. No. 6,387,735

[Patent Document 3] Japanese Unexamined Patent Publication No. 2006-190795

[Patent Document 4] U.S. Patent Laid-Open No. 2006-0183290

[Patent Document 5] Japanese Unexamined Patent Publication No. 2001-332723

SUMMARY OF THE INVENTION

In mass production of complementary metal insulator semiconductor (CMIS) integrated circuit devices or the like, electric characteristics, such as Vth (threshold voltage) or the like, disadvantageously vary due to fluctuations or variations in gate length (Lg) of the MISFET. This problem has become serious because of a short channel effect. In order to solve the problem, various kinds of feed-forward techniques have been studied in which a subsequent variation factor process (cancellation process) is regulated to be reversed with respect to fluctuations in a previous variation factor process (process contributing to the Vth) so as to cause these variation factors to cancel each other out.

The inventors of the present application have studied such feed-forward techniques, and thus found that since the feedback technique has an effect of the cancellation process over the entire system, the technique can be relatively easily applied to a product with a single type of MISFET (which also includes, for example, a pair of a p-type MISFET and an n-type MISFET as the one type in the CMIS device), but is difficult to be applied to a product equipped with a plurality of types of MISFETs. This is because the effect of the cancellation acts differently on the single type of MISFET and other types of MISFETs.

Thus, it is an object of the present invention to provide a manufacturing process for a semiconductor integrated circuit device which has smaller variations in electric characteristics.

The above, other objects and novel features of the invention will become apparent from the description of the present specification and the accompanying drawings.

The following is a brief description of representative aspects of the invention disclosed in the present specification.

That is, the present invention is directed to a manufacturing method for a semiconductor integrated circuit device using a feed-forward technique which includes a gate electrode patterning step and an offset spacer film-forming step as a composite variation factor process, and a halo implantation step as a cancellation process.

Effects obtained by the representative aspects of the invention disclosed in the specification will be briefly described below.

That is, according to the invention, variations in Vth or the like can be controlled with high accuracy even in products equipped with a plurality of types of MISFETs.

BRIEF DESCRIPTION OF THE DRAWINGS

FIG. 35 shows an example of a correction table (for the n-channel MISFET) used for correction of variations in Vth (based on the gate length or the like) in the manufacturing method for the semiconductor integrated circuit device according to the embodiment of the present application; and FIG. 36 shows an example of a correction table (for the p-channel MISFET) used for correction of variations in Vth (based on the gate length or the like) in the manufacturing method for the semiconductor integrated circuit device according to the embodiment of the present application.

DETAILED DESCRIPTION OF THE PREFERRED EMBODIMENTS

Summary of the Preferred Embodiments

Figure 1:
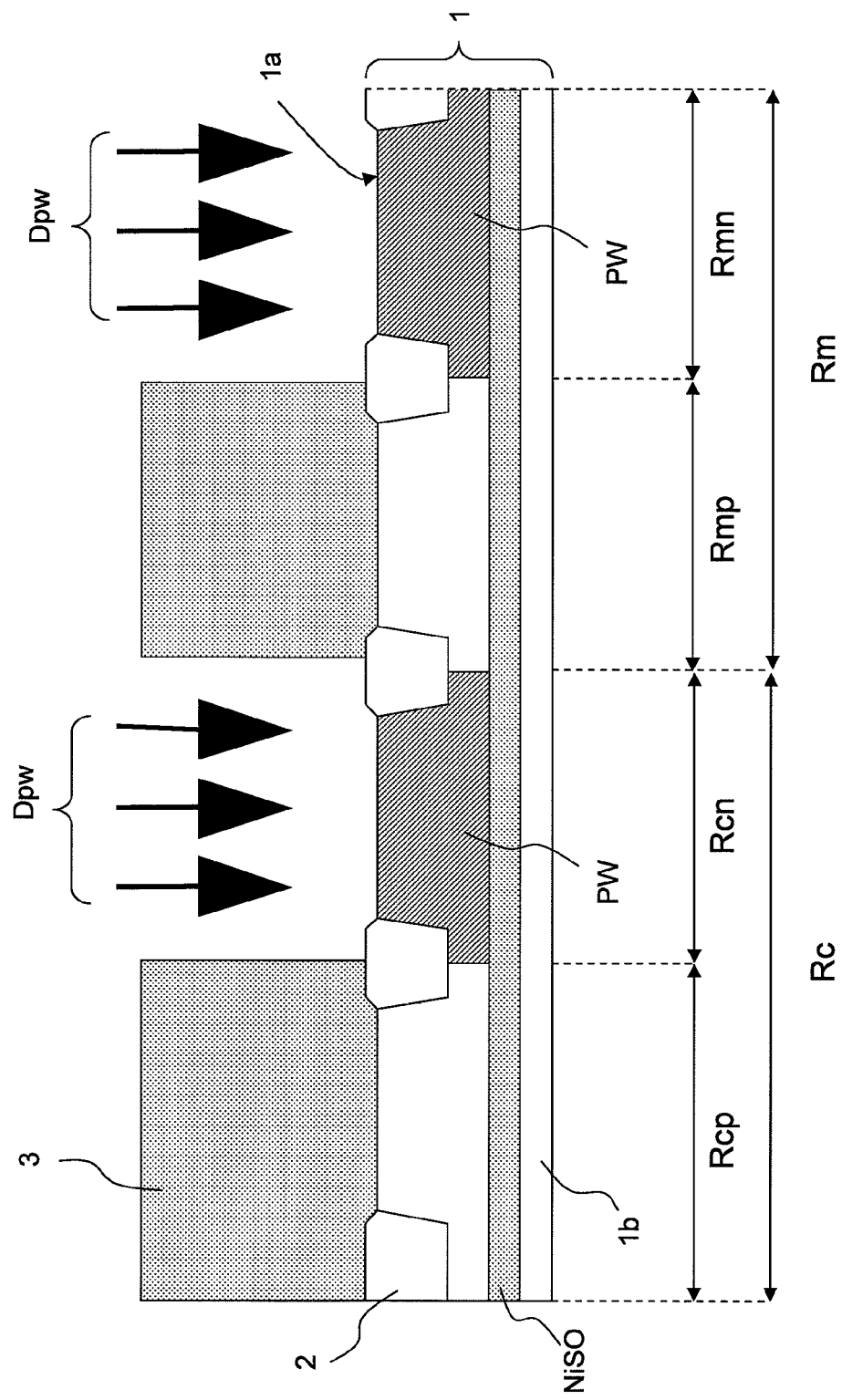
FIG. 1 is a sectional view of a semiconductor integrated circuit device in a wafer process (p-well ion implantation step) in a manufacturing method for the semiconductor integrated circuit device according to one embodiment of the present application.

First, the summary of representative embodiments of the invention disclosed in the present specification will be described below.

1. The invention provides a manufacturing method for a semiconductor integrated circuit device. The semiconductor integrated circuit device includes (x1) a semiconductor substrate having a first main surface; (x2) a first CMIS integrated circuit provided in a chip region of the first main surface of the semiconductor substrate, and having a first operating voltage; (x3) a first group of n-channel MISFETs provided in the first CMIS integrated circuit; and (x4) a first group of p-channel MISFETs provided in the first CMIS integrated circuit. The manufacturing method for the semiconductor integrate circuit device includes the steps of (a) forming respective gate electrodes for the first group of n-channel MISFETs and the first group of p-channel MISFETs over the first main surface of the semiconductor substrate; (b) measuring a gate length corresponding to the gate electrode over the first main surface of the semiconductor substrate; (c) forming a first insulating film serving as an offset spacer insulating film, over the first main surface of the semiconductor substrate including an upper surface and both sides of the gate electrode; (d) applying anisotropic dry etching to the first insulating film formed so as to leave the offset spacer insulating film at both sides of the gate electrode; (e) measuring a thickness of the first insulating film corresponding to a thickness of the offset spacer insulating film, over the first main surface of the semiconductor substrate; (f) performing p-halo ion implantation into the first group of n-channel MISFETs according to a dose amount defined in response to the gate length and the thickness measured; and (g) performing n-halo ion implantation into the first group of p-channel MISFETs according to a dose amount defined in response to the gate length and the thickness measured.

2. In the manufacturing method for the semiconductor integrated circuit device according to Item 1, the semiconductor integrated circuit device further includes (x5) a second CMIS integrated circuit provided in the chip region of the first main surface of the semiconductor substrate, and having a second operating voltage higher than the first operating voltage.

3. In the manufacturing method for the semiconductor integrated circuit device according to Item 1 or 2, the semiconductor integrate circuit device further includes: (x5) a second CMIS integrated circuit provided in the chip region of the first main surface of the semiconductor substrate, and having a second operating voltage higher than the first operating voltage; and (x6) a third CMIS integrated circuit provided in the chip region of the first main surface of the semiconductor substrate, and having a third operating voltage higher than the second operating voltage.

4. In the manufacturing method for the semiconductor integrated circuit device according to any one of Items 1 to 3, the steps (f) and (g) are performed after the step (c).

5. In the manufacturing method for the semiconductor integrated circuit device according to any one of Items 1 to 4, the step (e) is performed after the step (c) and before the step (d).

6. In the manufacturing method for the semiconductor integrated circuit device according to any one of Items 1 to 5, the step (b) is performed after the step (a) and before the step (c).

7. In the manufacturing method for the semiconductor integrated circuit device according to any one of Items 1 to 6, the semiconductor integrated circuit device further include: (x5) a second CMIS integrated circuit provided in the chip region of the first main surface of the semiconductor substrate, and having a second operating voltage higher than the first operating voltage. The halo ion implantation into the second CMIS integrated circuit is performed before the step (c).

8. In the manufacturing method for the semiconductor integrated circuit device according to any one of Items 1 to 7, the semiconductor integrated circuit device further include: (x5) a second CMIS integrated circuit provided in the chip region of the first main surface of the semiconductor substrate, and having a second operating voltage higher than the first operating voltage. The second CMIS integrated circuit includes a second group of n-channel MISFETs. The second group of n-channel MISFETs includes a lower-level group of n-channel MISFETs with different threshold voltages.

9. The manufacturing method for the semiconductor integrated circuit device according to any one of Items 1 to 8 further includes the steps of: (h) after the step (g), forming side wall spacer insulating films at both sides of the offset spacer insulating films located at both sides of the gate electrode; (i) after the step (g), implanting p-type high-concentration impurities for forming a heavily doped source/drain region, into the first group of p-channel MISFETs; and (j) after the step (g), implanting n-type high-concentration impurities for forming the heavily doped source/drain region, into the first group of n-channel MISFETs.

10. In the manufacturing method for the semiconductor integrated circuit device according to any one of Items 1 to 9, the semiconductor integrated circuit device further include: (x5) a second CMIS integrated circuit provided in the chip region of the first main surface of the semiconductor substrate, and having a second operating voltage higher than the first operating voltage. The manufacturing method for the semiconductor integrated circuit device further includes the steps of: (h) after the step (g), forming side wall spacer insulating films at both sides of the offset spacer insulating films located at both sides of the gate electrode; (i) after the step (g), implanting p-type high-concentration impurities for forming a heavily doped source/drain region, into the first group of p-channel MISFETs; and (j) after the step (g), implanting n-type high-concentration impurities for forming the heavily doped source/drain region, into the first group of n-channel MISFETs. Further, in implanting the p-type high-concentration impurities and the n-type high-concentration impurities, the implantation of the p-type high-concentration impurities and of the n-type high-concentration impurities is performed to respectively form the heavily doped source/drain regions for the p-channel MISFET group and the n-channel MISFET group of the second CMIS integrated circuit.

11. In the manufacturing method for the semiconductor integrated circuit device according to any one of Items 1 to 10, the semiconductor integrated circuit device further includes: (x5) a second CMIS integrated circuit provided in the chip region of the first main surface of the semiconductor substrate, and having a second operating voltage higher than the first operating voltage; and (x6) a third CMIS integrated circuit provided in the chip region of the first main surface of the semiconductor substrate, and having a third operating voltage higher than the second operating voltage. The manufacturing method for the semiconductor integrated circuit device further includes the steps of: (h) after the step (g), forming side wall spacer insulating films at both sides of the offset spacer insulating films located at both sides of the gate electrode; (i) after the step (g), implanting p-type high-concentration impurities for forming a heavily doped source/drain region, into the first group of p-channel MISFETs; and (j) after the above step (g), implanting n-type high-concentration impurities for forming the heavily doped source/drain region, into the first group of n-channel MISFETs. Further, in implanting the p-type high-concentration impurities and the n-type high-concentration impurities, the implantation of the p-type high-concentration impurities and of the n-type high-concentration impurities is performed to respectively form the heavily doped source/drain regions for the p-channel MISFET group and the n-channel MISFET group of each of the second and third CMIS integrated circuits.

12. In the manufacturing method for the semiconductor integrated circuit device according to any one of Items 1 to 11, the first group of n-channel MISFETs includes a lower-level group of n-channel MISFETs with different threshold voltages.

13. In a manufacturing method for a semiconductor integrated circuit device, the semiconductor integrated circuit device further includes: (x1) a semiconductor substrate having a first main surface; (x2) a first CMIS integrated circuit provided in a chip region of the first main surface of the semiconductor substrate, and having a first operating voltage; (x3) a first group of n-channel MISFETs provided in the first CMIS integrated circuit; and (x4) a first group of p-channel MISFETs provided in the first CMIS integrated circuit. The manufacturing method for the semiconductor integrated circuit device further includes the steps of: (a) forming a gate insulating film over the first main surface of the semiconductor substrate; (b) measuring a thickness of the gate insulating film over the first main surface of the semiconductor substrate; (c) forming a gate electrode for each of the first group of n-channel MISFETs and the first group of p-channel MISFETs over the gate insulating film; (d) forming a first insulating film serving as an offset spacer insulating film, over the first main surface of the semiconductor substrate including an upper surface and both sides of the gate electrode; (e) applying anisotropic etching to the first insulating film formed such that offset spacer films are left over both sides of the gate electrode; (f) performing p-halo ion implantation into the first group of n-channel MISFETs according to a dose amount defined in response to the measured thickness of the gate insulating film; and (g) performing n-halo ion implantation into the first group of p-channel MISFETs according to a dose amount defined in response to the measured thickness of the gate insulating film.

14. In the manufacturing method for the semiconductor integrated circuit device according to Item 13, the semiconductor integrated circuit device further includes (x5) a second CMIS integrated circuit provided in the chip region of the first main surface of the semiconductor substrate, and having a second operating voltage higher than the first operating voltage.

15. In the manufacturing method for the semiconductor integrated circuit device according to Item 13 or 14, the semiconductor integrated circuit device further includes: (x5) a second CMIS integrated circuit provided in the chip region of the first main surface of the semiconductor substrate, and having a second operating voltage higher than the first operating voltage; and (x6) a third CMIS integrated circuit provided in the chip region of the first main surface of the semiconductor substrate, and having a third operating voltage higher than the second operating voltage.

16. In the manufacturing method for the semiconductor integrated circuit device according to any one of Items 13 to 15, the semiconductor integrated circuit device further includes: (x5) a second CMIS integrated circuit provided in the chip region of the first main surface of the semiconductor substrate, and having a second operating voltage higher than the first operating voltage. The manufacturing method for the semiconductor integrated circuit device further includes the steps of: (h) after the step (g), forming side wall spacer insulating films at both sides of the offset spacer insulating films located at both sides of the gate electrode; (i) after the step (g), implanting p-type high-concentration impurities for forming a heavily doped source/drain region, into the first group of p-channel MISFETs; and (j) after the above step (g), implanting n-type high-concentration impurities for forming the heavily doped source/drain region, into the first group of n-channel MISFETs.

17. In the manufacturing method for the semiconductor integrated circuit device according to any one of Items 13 to 16, the semiconductor integrated circuit device further includes: (x5) a second CMIS integrated circuit provided in the chip region of the first main surface of the semiconductor substrate, and having a second operating voltage higher than the first operating voltage. The manufacturing method for the semiconductor integrated circuit device further includes the steps of: (h) after the step (g), forming side wall spacer insulating films at both sides of the offset spacer insulating films located at both sides of the gate electrode; (i) after the step (g), implanting p-type high-concentration impurities for forming a heavily doped source/drain region, into the first group of p-channel MISFETs; and (j) after the above step (g), implanting n-type high-concentration impurities for forming the heavily doped source/drain region, into the first group of n-channel MISFETs. Further, in implanting the p-type high-concentration impurities and the n-type high-concentration impurities, the implantation of the p-type high-concentration impurities and of the n-type high-concentration impurities is performed to respectively form the heavily doped source/drain regions for the p-channel MISFET group and the n-channel MISFET group of the second CMIS integrated circuit.

18. In the manufacturing method for the semiconductor integrated circuit device according to any one of Items 13 to 17, the semiconductor integrated circuit device further includes: (x5) a second CMIS integrated circuit provided in the chip region of the first main surface of the semiconductor substrate, and having a second operating voltage higher than the first operating voltage; and (x6) a third CMIS integrated circuit provided in the chip region of the first main surface of the semiconductor substrate, and having a third operating voltage higher than the second operating voltage. The manufacturing method for the semiconductor integrated circuit device further includes the steps of: (h) after the step (g), forming side wall spacer insulating films at both sides of the offset spacer insulating films located at both sides of the gate electrode; (i) after the step (g), implanting p-type high-concentration impurities for forming a heavily doped source/drain region, into the first group of p-channel MISFET; and (j) after the step (g), implanting n-type high-concentration impurities for forming the heavily doped source/drain region, into the first group of n-channel MISFETs. Further, in implanting the p-type high-concentration impurities and the n-type high-concentration impurities, the implantation of the p-type high-concentration impurities and of the n-type high-concentration impurities is performed to respectively form the heavily doped source/drain regions for the p-channel MISFET group and the n-channel MISFET group of each of the second and third CMIS integrated circuits.

19. In the manufacturing method for the semiconductor integrated circuit device according to any one of Items 13 to 18, the measurement of the thickness of the gate insulating film is performed after the step (a) and before forming a gate electrode film.

20. In the manufacturing method for the semiconductor integrated circuit device according to any one of Items 13 to 19, the first group of n-channel MISFETs includes a lower-level group of n-channel MISFETs with different threshold voltages.

[Explanation of Description Format, Basic Terms, and Usage in Present Application]

1. In the present application, the description of preferred embodiments may be divided into sections for convenience, if necessary, but these embodiments are not individually separated from each other except when specified otherwise. Each embodiment indicates each component of a single example, a detailed part of another embodiment, or a modified example of a part or all of another embodiment. In principle, the description of the same part will be omitted. Each component of the embodiment is not essential except when specified otherwise, in theory, except when the number of components is limited, and except when indicated otherwise from the context.

2. Likewise, in the description of the embodiments or the like, the phrase "X made of A" about material, component, or the like does not exclude a member containing an element other than A as a principal component, except when specified otherwise, and except when indicated from the context. For example, as to a component, the above phrase means "X containing A as a principal component" or the like. It is apparent that for example, the term "a silicon member" or the like is not limited to pure silicon, and may include multicomponent alloy containing SiGe alloy or other silicon materials as a principal component, and a member containing other additives or the like. Likewise, it is also apparent that the term "silicon oxide film" include not only a film made of relatively pure undoped silicon dioxide; but also a thermally-oxidized film made of fluorosilicate glass (FSG), TEOS-based silicon oxide, silicon oxicarbide (SiOC), or carbon-doped silicon oxide, or organosilicate glass (OSG), phosphorus silicate glass (PSG), borophosphosilicate glass (BPSG), or the like; a CVD oxide film; a coating type silicon oxide film made of spin on glass (SOG), nano-clustering silica (NSC), or the like; a silica-based Low-k insulating film (porous insulating film) made of the same member as described above having holes; and a composite film or the like containing the over-mentioned material as a principal component, with another silicon-based insulating film.

3. Likewise, it is apparent that preferred examples of diagrams, positions, properties, and the like are described in the embodiments, but the invention is not strictly limited thereto except when specified otherwise, and except when indicated otherwise from the context.

4. Further, when referring to a specific value or quantity, the invention may have a value exceeding the specific value, or may have a value less than the specific value except when specified otherwise, in theory, except when the number of components is limited, and except when indicated otherwise from the context.

5. The term "wafer" or "semiconductor substrate" generally indicates a single crystal silicon wafer over which a semiconductor integrated circuit device (note that the same goes for a semiconductor device, and an electronic device) is formed, but may include a composite wafer of an insulating substrate, such as an epitaxial wafer or a SOI wafer, and a semiconductor layer or the like. The "semiconductor chip" or "chip region" indicates a unit integrated circuit region serving as a part of a wafer or the like during the manufacturing process, and is formed by dividing the wafer into a semiconductor chips after the wafer process by dicing or the like.

6. An impurity layer structure of the short channel MISFET includes a deep high-concentration "heavily doped source/drain region", and the same conductivity type low-concentration "extension region (LDD region)" which is shallow as compared to the source/drain region. A "halo ion implantation" or "halo region (pocket region)" corresponds to a relatively low-concentration region of an opposed conductivity type to the above region, and finally forms a region having a higher concentration than a well region in an internal area under a channel region near the tip of the extension region. The ion implantation into the halo region has the feature that while the normal ion implantation into the heavily doped source/drain region and the extension region is performed substantially vertically to a device surface of the wafer, the ion implantation into the halo region is performed in directions using beams inclined about by 45 degrees. That is, the implantation is inclined implantation or large angle implantation.

The representative concentration relationship between respective impurity regions in completion of the device is broadly defined as follows. That is, substrate<deep well<well<halo region<extension region<heavily doped source/drain region.

7. A peripheral structure around the gate of the short channel MISFET has two films, namely, an "offset spacer insulating film", and a "side wall spacer insulating film". The "offset spacer insulating film" defines the edges of the extension region and of the halo region upon ion implantation in a low operating voltage device system. In contrast, the "side wall spacer insulating film" contains therein the offset spacer insulating film from the viewpoint of structure, and defines the edge of the "heavily doped source/drain region" upon ion implantation in the low operating voltage device system and other systems.

Further Detailed Description of the Preferred Embodiments

The preferred embodiments will be described below in detail. In each drawing, the same or similar part is designated by the same or similar reference character or numeral, and a description thereof will not be repeated in principle.

1. Explanation of Classification or the Like of Device Systems in Semiconductor Integrated Circuit Chip (SOC) Fabricated by Manufacturing Method for Semiconductor Integrated Circuit Device of One Embodiment of Present Application (see mainly FIG. 34)

Figure 34:
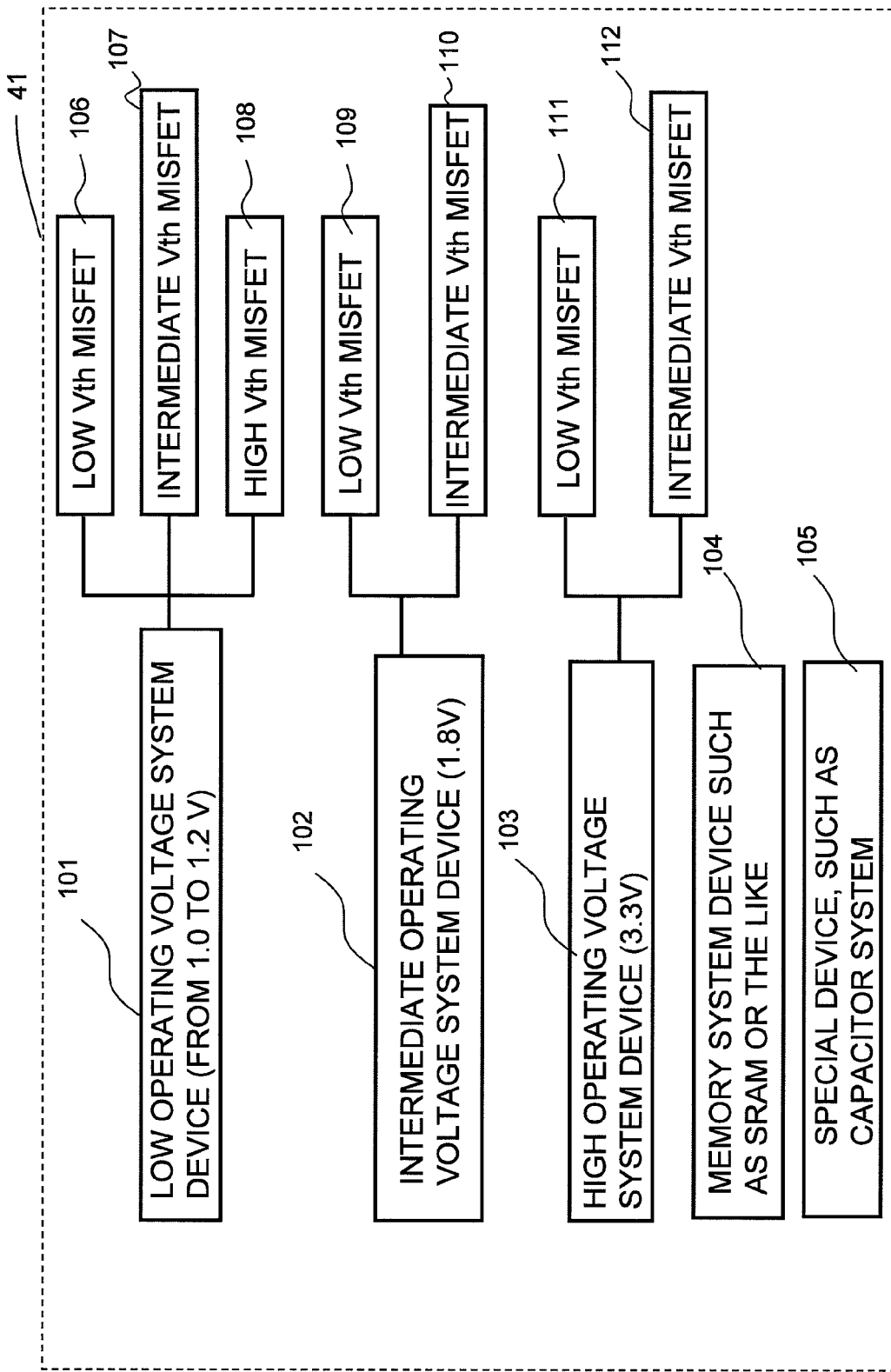
FIG. 34 is a classification map of device systems in a semiconductor integrated circuit chip (SOC) fabricated by the manufacturing method for the semiconductor integrated circuit according to the embodiment of the present application.

FIG. 34 is a classification map of device systems in the semiconductor integrated circuit chip (SOC) fabricated by the manufacturing method for the semiconductor integrated circuit of one embodiment. Based on this, the classification of the device systems in the semiconductor integrated circuit chip fabricated by the manufacturing method for the semiconductor integrated circuit device of one embodiment will be described below. In the following, a system-on-chip (SOC) type device of 65 nm technology node will be described as one example.

As shown in FIG. 34, the SOC type semiconductor integrated circuit chip 41 normally includes a plurality of device systems. In this embodiment, the semiconductor integrated circuit chip 41 includes a low operating voltage device system constituting a main logic or memory circuit (except for a part specific to a memory), that is, a first CMIS integrated circuit 101 (having an operating voltage of, for example, 1 to 1.2 volts, which is hereinafter referred to a "core and device system"), an intermediate operating voltage I/O device system, that is, a second CMIS integrated circuit 102 (having an operating voltage of, for example, 1.8 volts), and a high operating voltage I/O device system, that is, a third CMIS integrated circuit 103 (having an operating voltage of, for example, 3.3 volts). It is apparent that these systems contain p-type and n-type device systems (for example, the low operating voltage device system 101 includes a first group of n-channel MISFETs and a first group of p-channel MISFETs). Further, each device system includes lower-level device systems with different Vths (for example, the low operating voltage device system 101 includes a low Vth system 106, an intermediate Vth system 107, a high Vth system 108, and the intermediate operating voltage I/O device system or the high operating voltage I/O device system includes low Vth system 109 or 111, and intermediate Vth system 110 or 112). The lower-level device systems with different Vths include lower-level groups of both conductivity type MISFETs. For example, the intermediate operating voltage I/O device system includes a second lower-level group of n-channel MISFETs, and a second lower-level group of p-channel MISFETs. Additionally, if necessary, the chip includes a device system 104 specific to a memory circuit, such as a SRAM, a DRAM, a flash memory, a FRAM, or a MRAM, and a device system 105 specific to special elements, such as a special capacitor, diode, or resistance element.

In the following description, p-type and n-type MISFET device regions (in the main description, a device region of the n-type MISFET) of the respective intermediate Vth systems 107 and 110 of the low operating voltage device system 101 and the intermediate operating voltage I/O device system 102 will be mainly described by way of example.

In one example described below, the correction of Vth by the feed forward control in the manufacturing method for the semiconductor integrated circuit device according to one embodiment of the present application is performed for the low operating voltage device system 101 having relatively large variations in Vth (each MISFET in the low Vth system 106, the intermediate Vth system 107, and the high Vth system 108).

2. Explanation of Process Flow of Wafer Process in Manufacturing Method for Semiconductor Integrated Circuit Device of One Embodiment of Present Application (see mainly FIGS. 1 to 21)

Figure 2:
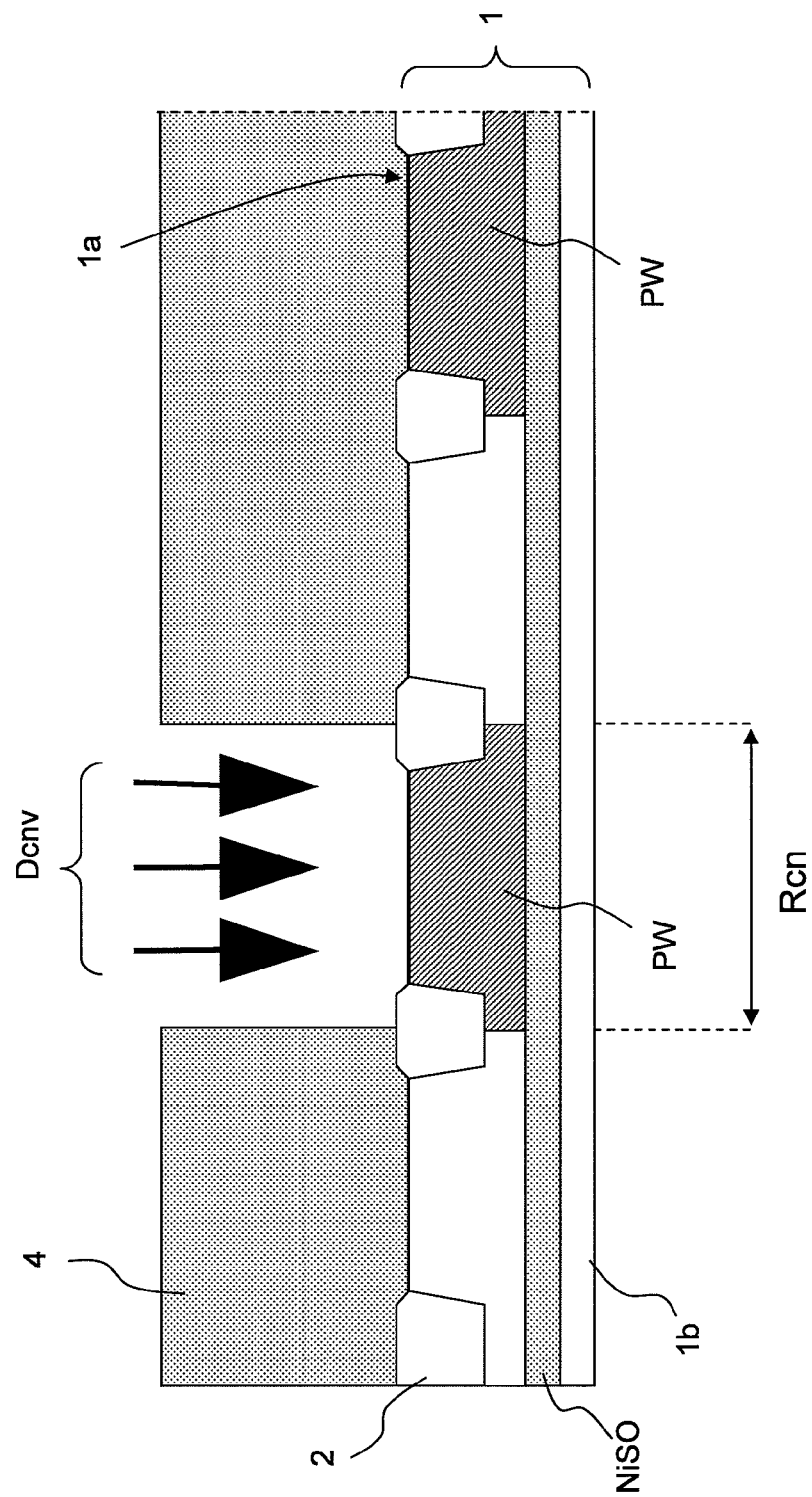
FIG. 2 is a sectional view of the device in the wafer process (threshold voltage adjustment ion implantation step at an n-channel MISFET) in the manufacturing method for the semiconductor integrated circuit device according to the embodiment of the present application.
Figure 3:
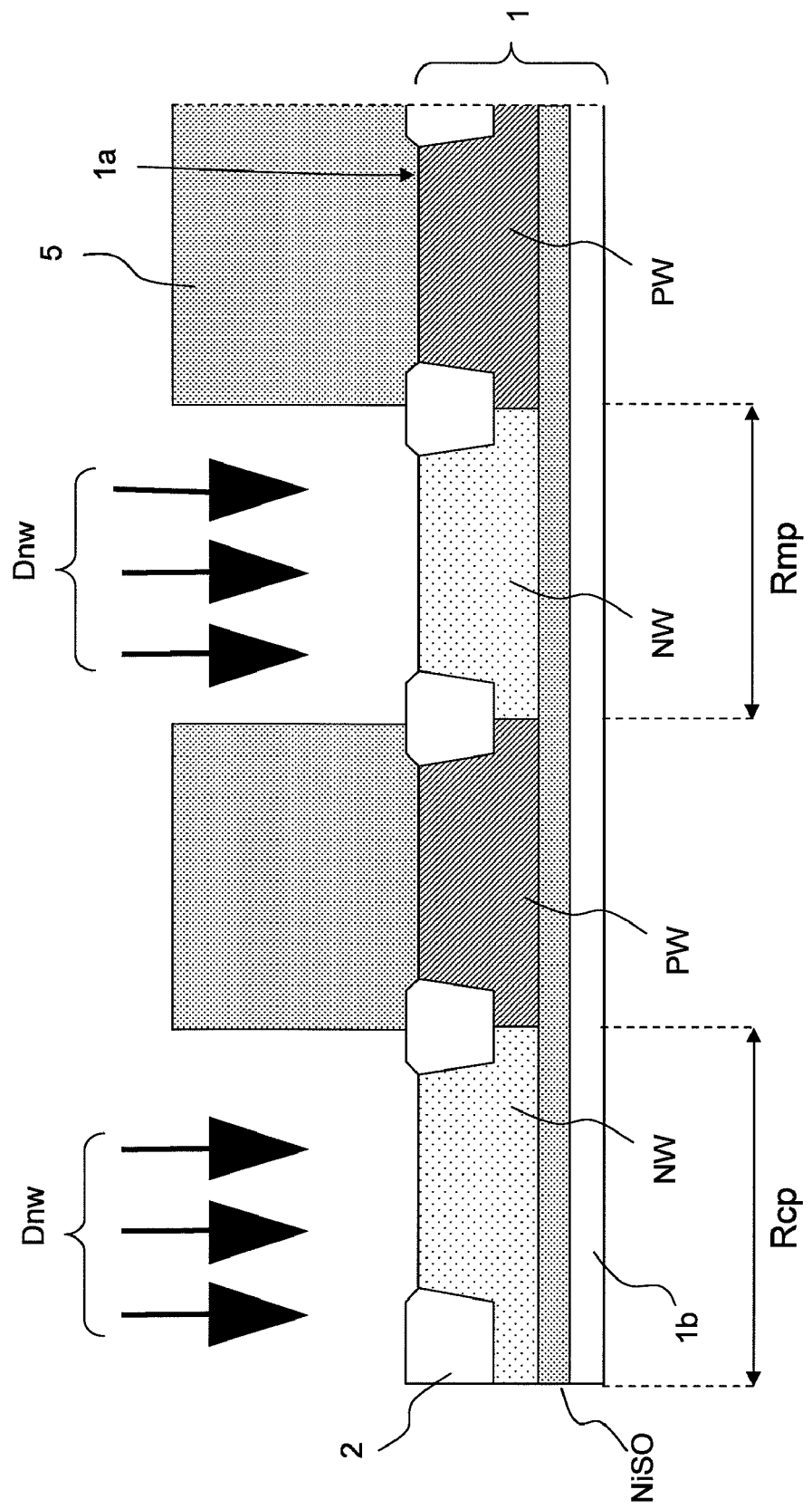
FIG. 3 is a sectional view of the device in the wafer process (n-well ion implantation step) in the manufacturing method for the semiconductor integrated circuit device according to the embodiment of the present application.
Figure 4:
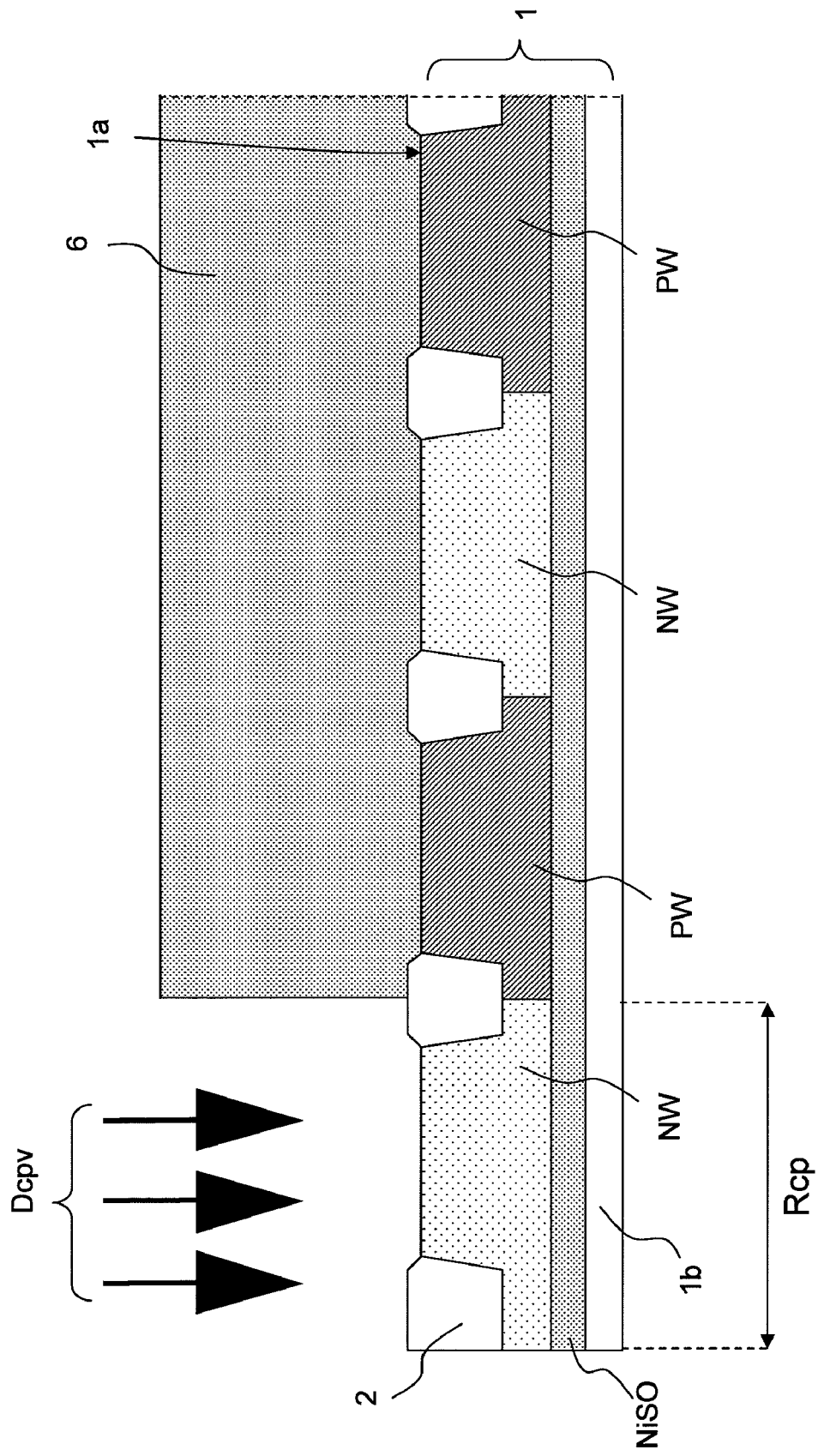
FIG. 4 is a sectional view of the device in the wafer process (threshold voltage adjustment ion implantation step at a p-channel MISFET) in the manufacturing method for the semiconductor integrated circuit device according to the embodiment of the present application.
Figure 5:
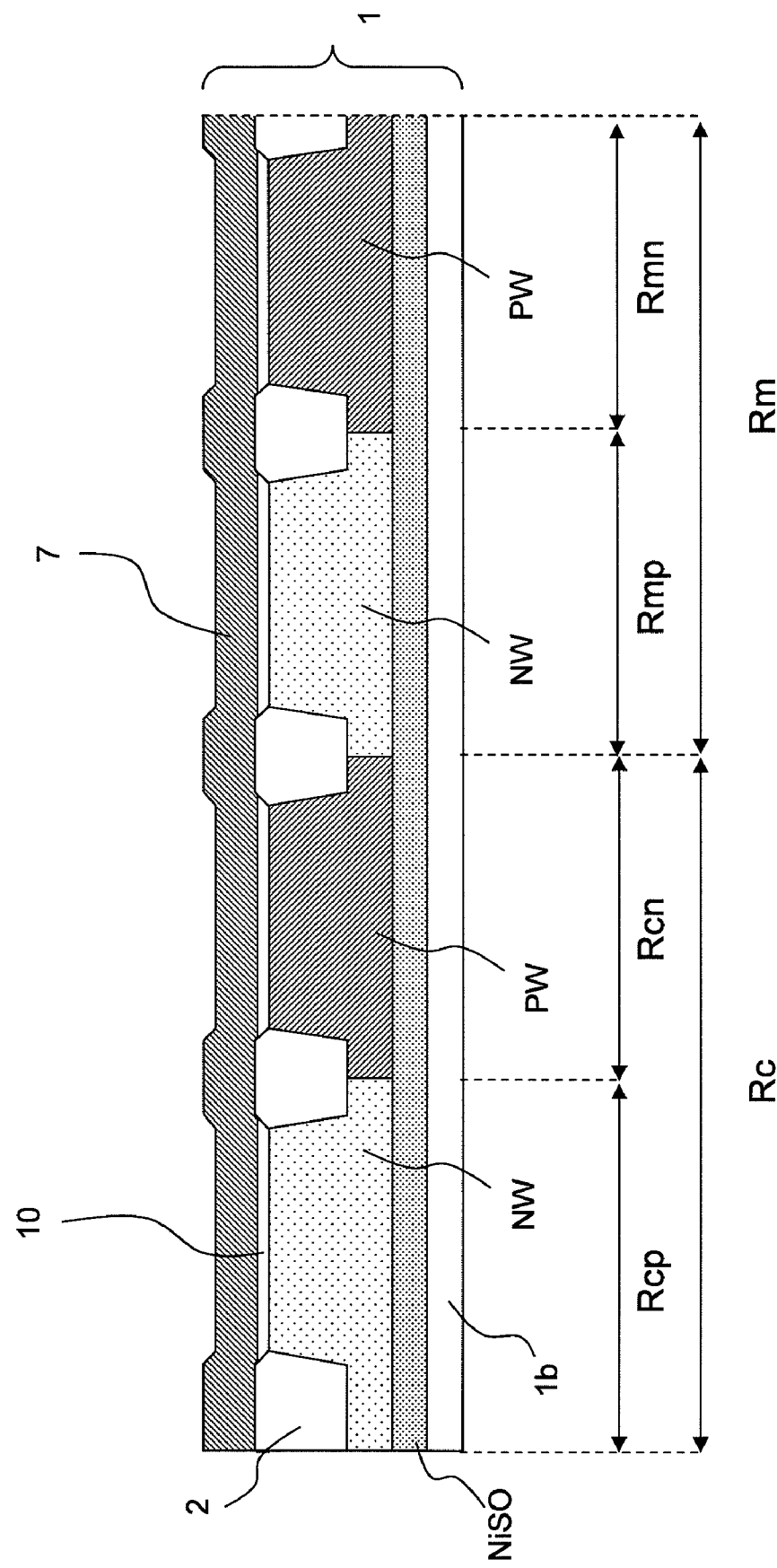
FIG. 5 is a sectional view of the device in the wafer process (polysilicon coating step) in the manufacturing method for the semiconductor integrated circuit device according to the embodiment of the present application.
Figure 6:
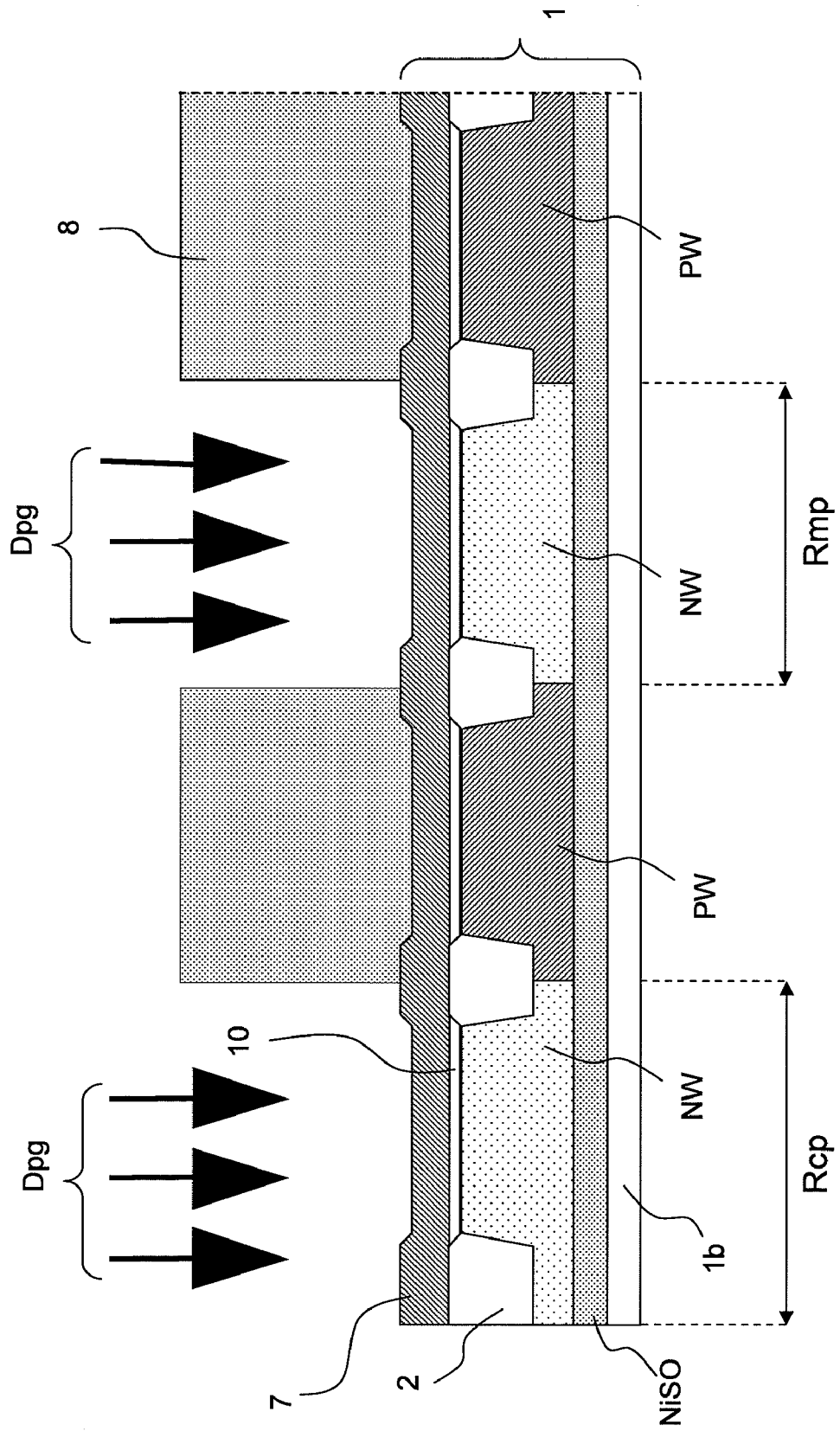
FIG. 6 is a sectional view of the device in the wafer process (p-type impurity ion implantation step into the polysilicon film) in the manufacturing method for the semiconductor integrated circuit device according to the embodiment of the present application.
Figure 7:
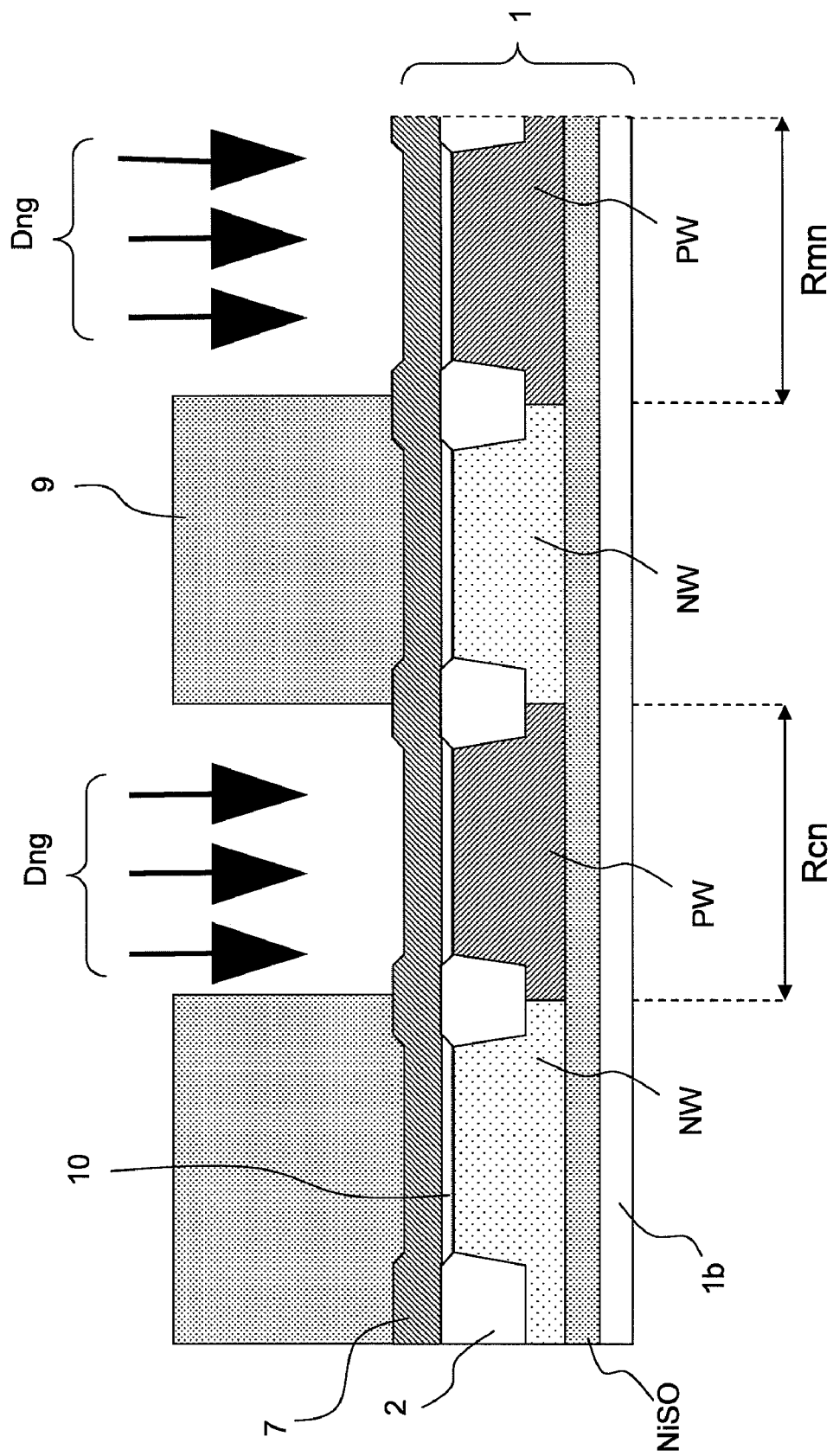
FIG. 7 is a sectional view of the device in the wafer process (n-type impurity ion implantation step into the polysilicon film) in the manufacturing method for the semiconductor integrated circuit device according to the embodiment of the present application.
Figure 8:
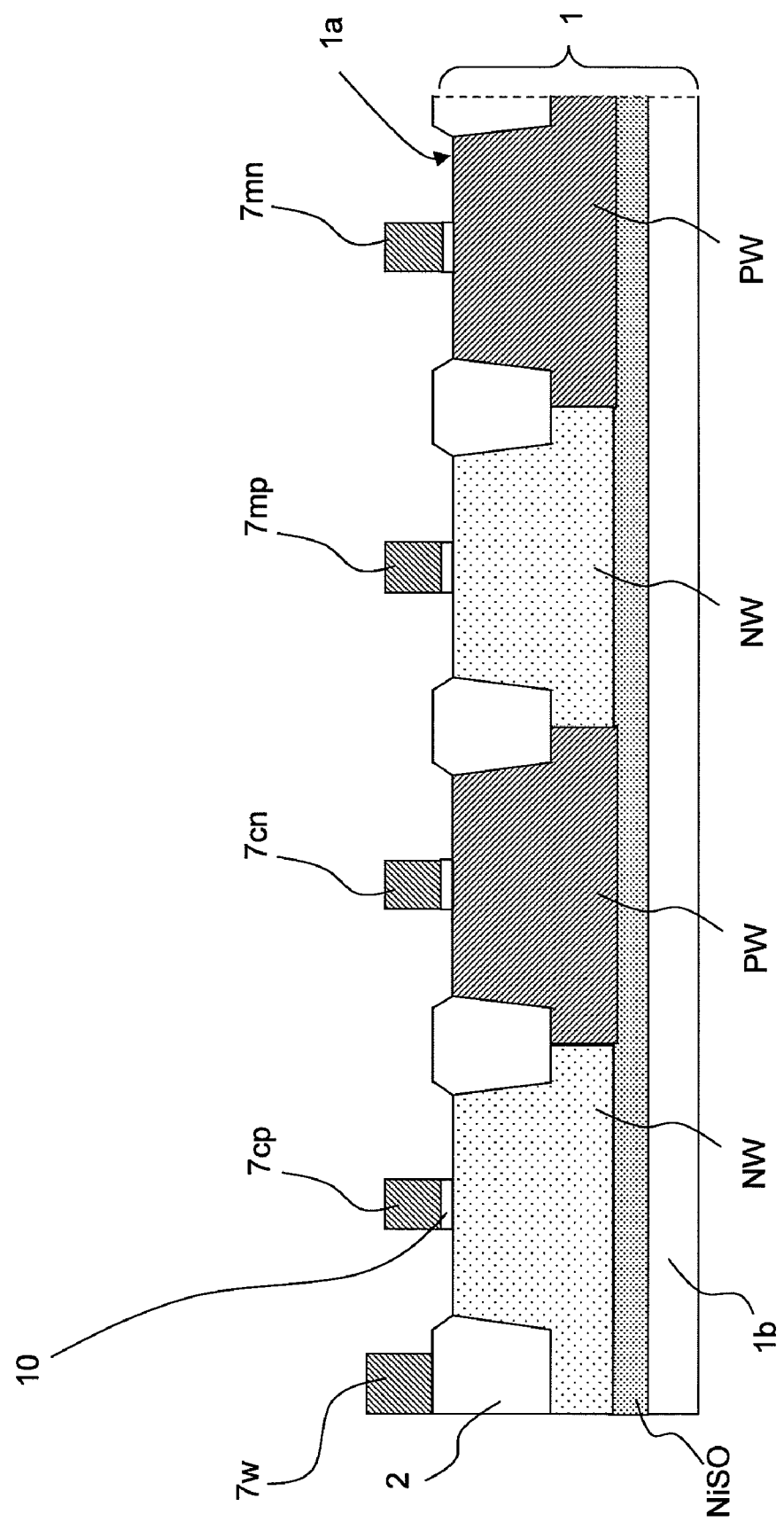
FIG. 8 is a sectional view of the device in the wafer process (gate electrode patterning and implantation step) in the manufacturing method for the semiconductor integrated circuit device according to the embodiment of the present application.
Figure 9:
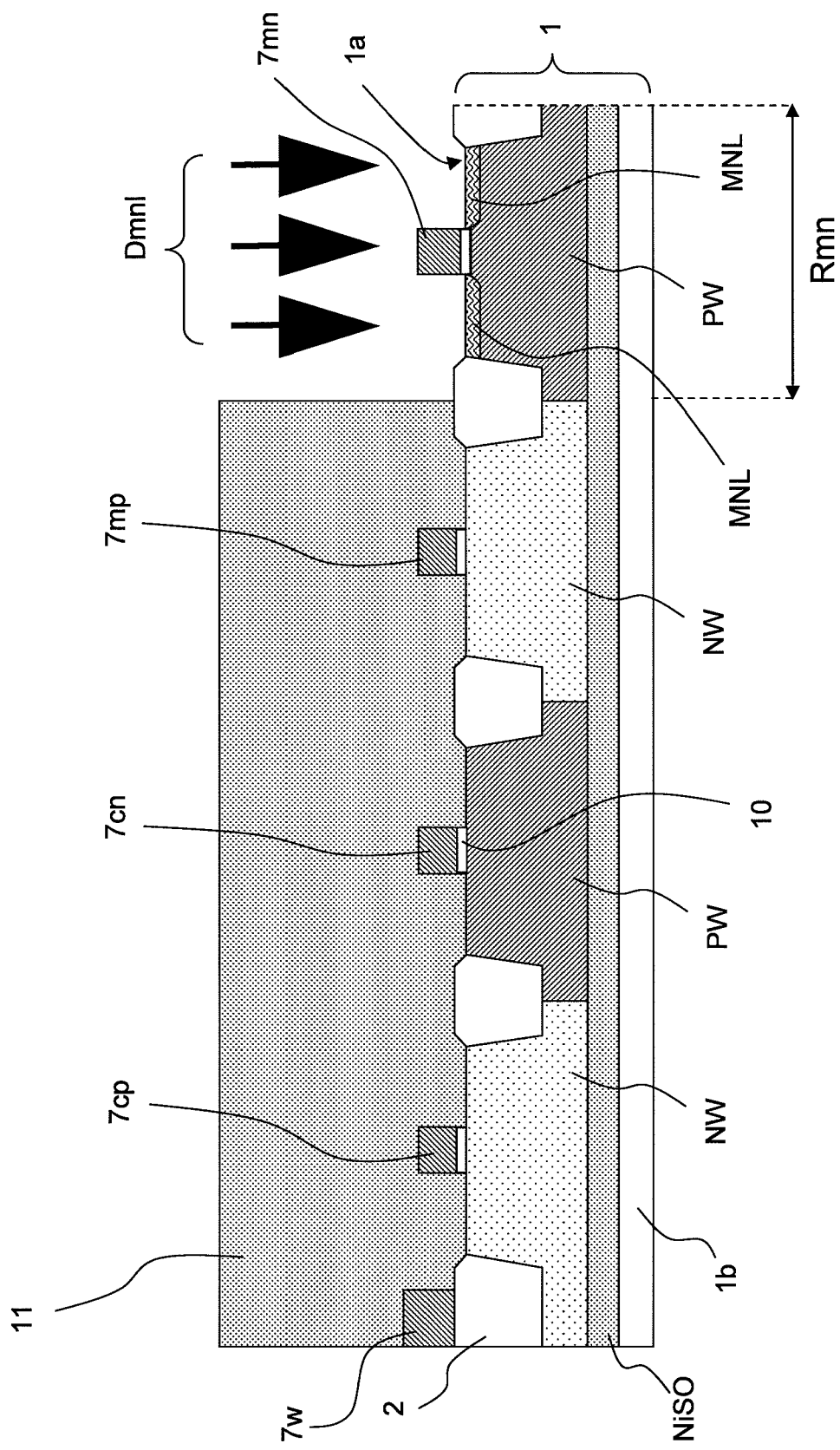
FIG. 9 is a sectional view of the device in the wafer process (ion implantation step into a LDD region of the n-channel MISFET having an intermediate operating voltage) in the manufacturing method for the semiconductor integrated circuit device according to the embodiment of the present application.
Figure 10:
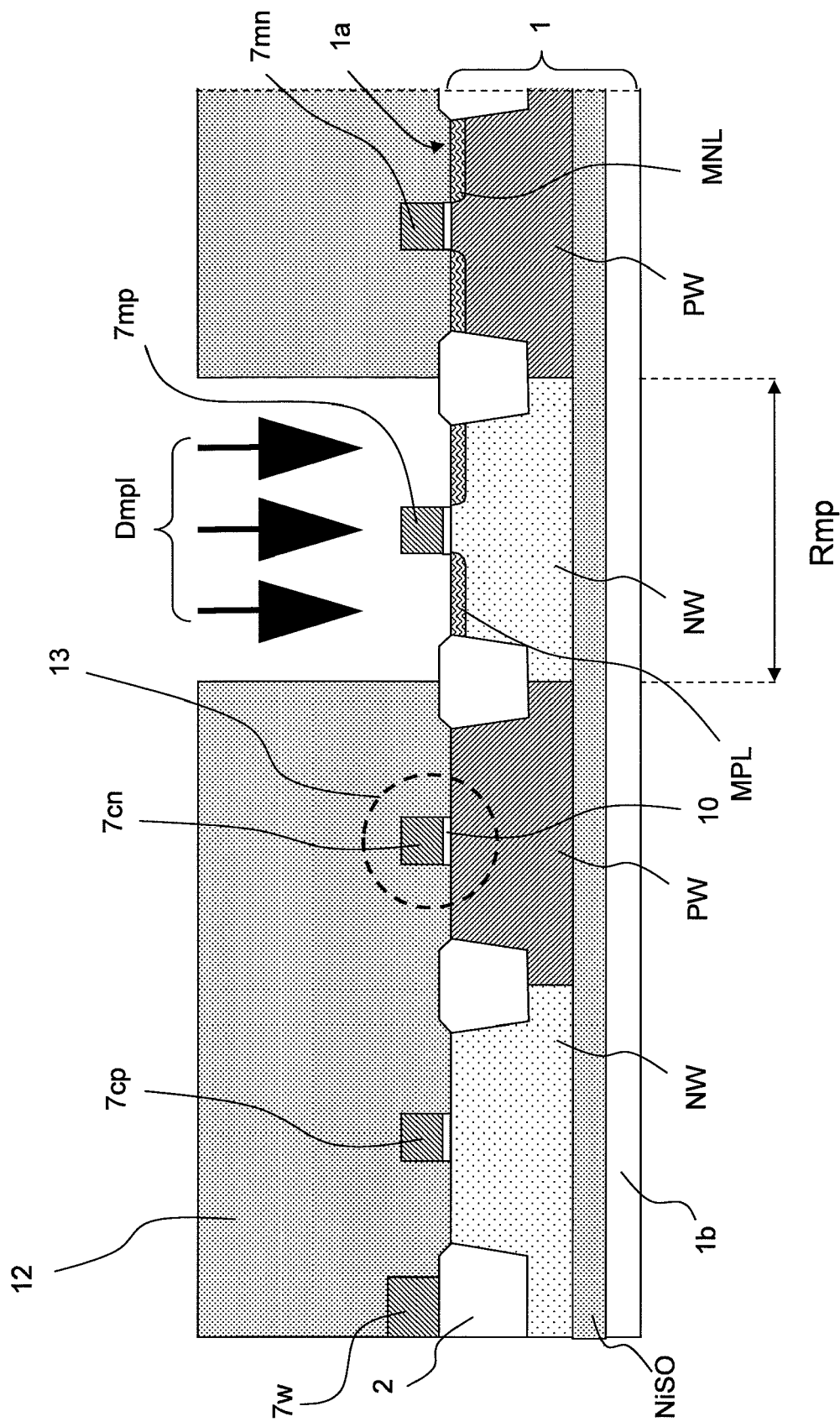
FIG. 10 is a sectional view of the device in the wafer process (ion implantation step into a LDD region of the p-channel MISFET having an intermediate operating voltage) in the manufacturing method for the semiconductor integrated circuit device according to the embodiment of the present application.
Figure 11:
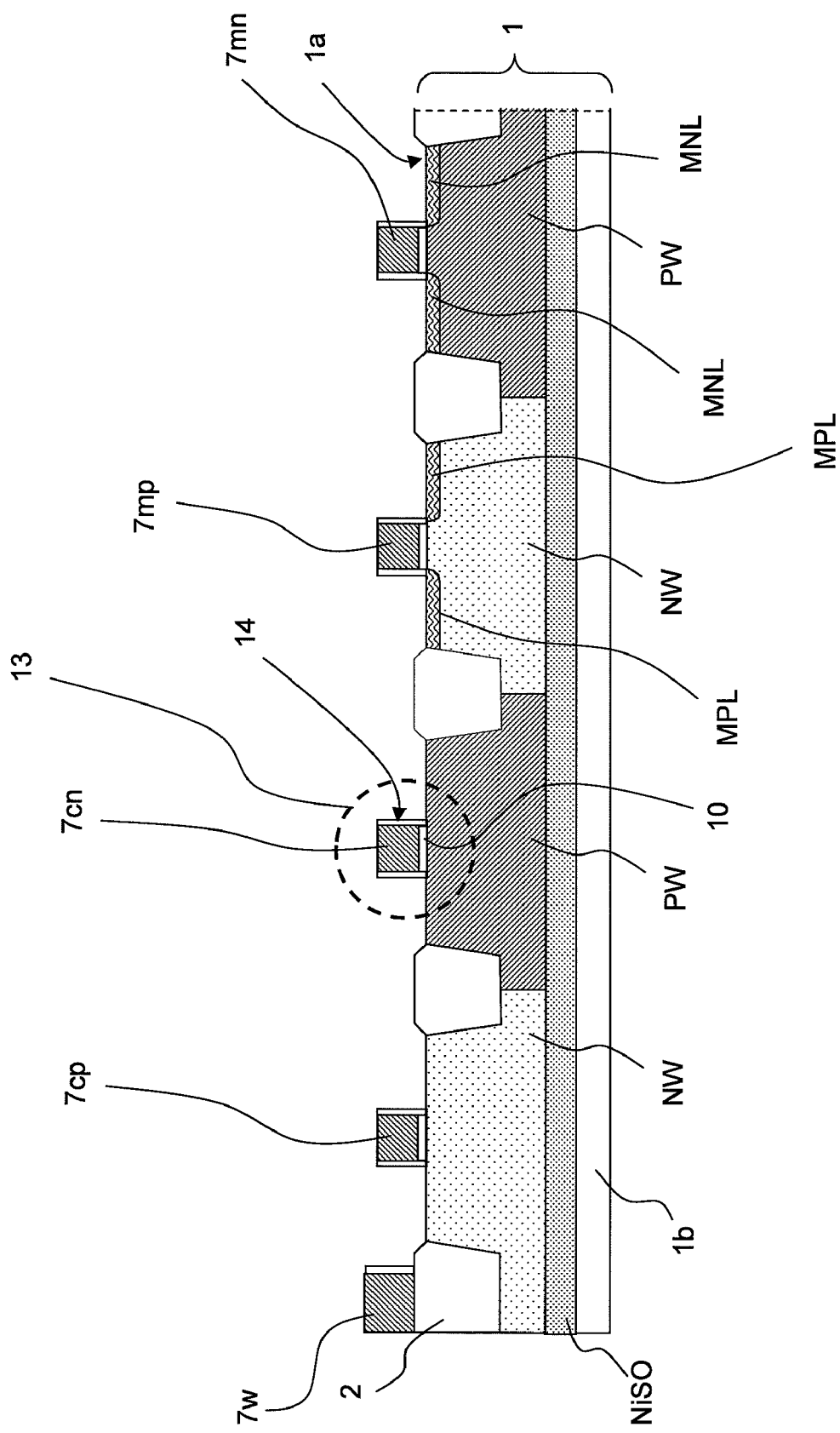
FIG. 11 is a sectional view of the device in the wafer process (offset spacer forming step) in the manufacturing method for the semiconductor integrated circuit device according to the embodiment of the present application.
Figure 12:
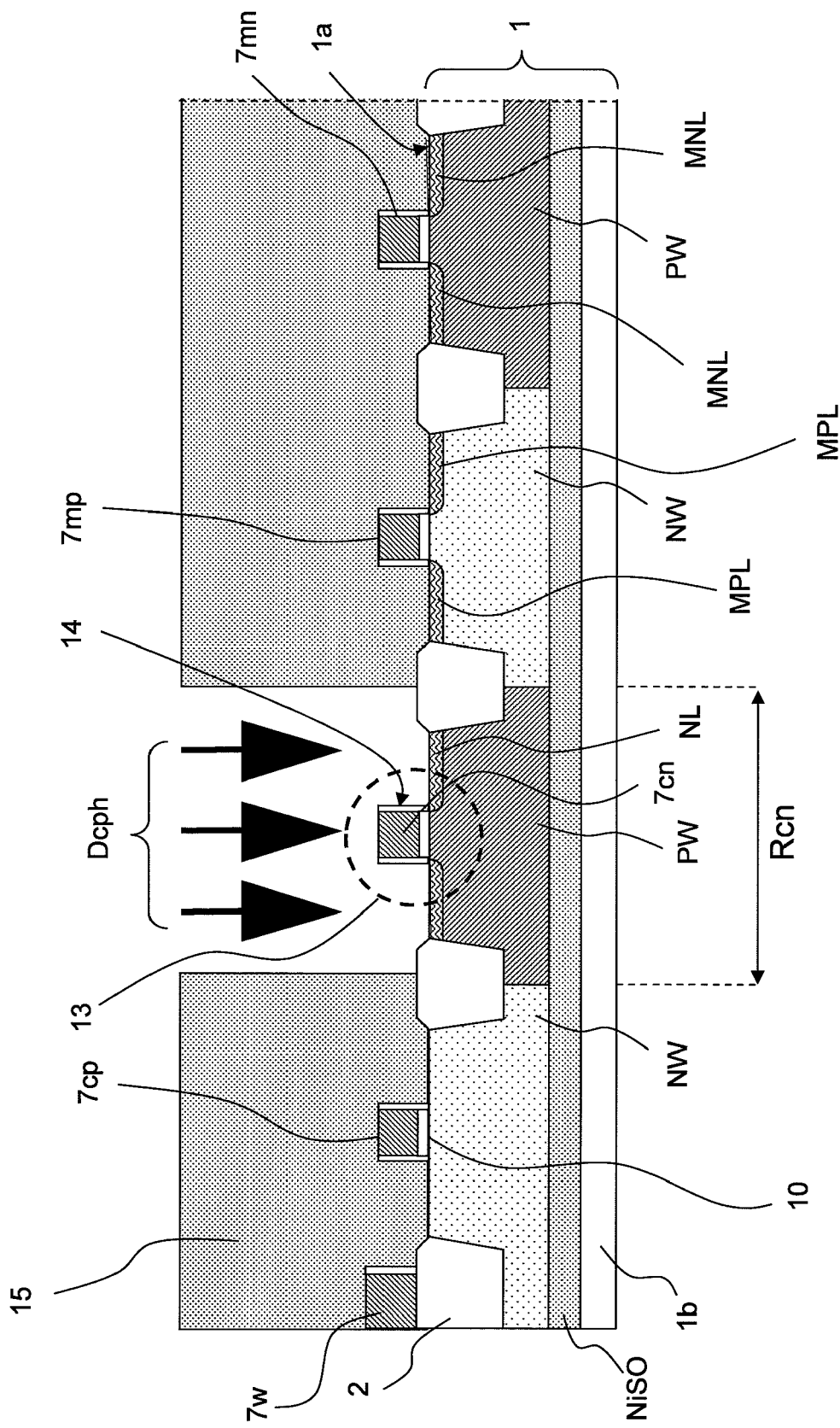
FIG. 12 is a sectional view of the device in the wafer process (p-type halo implantation step into the n-channel MISFET having a low operating voltage) in the manufacturing method for the semiconductor integrated circuit device according to the embodiment of the present application.
Figure 13:
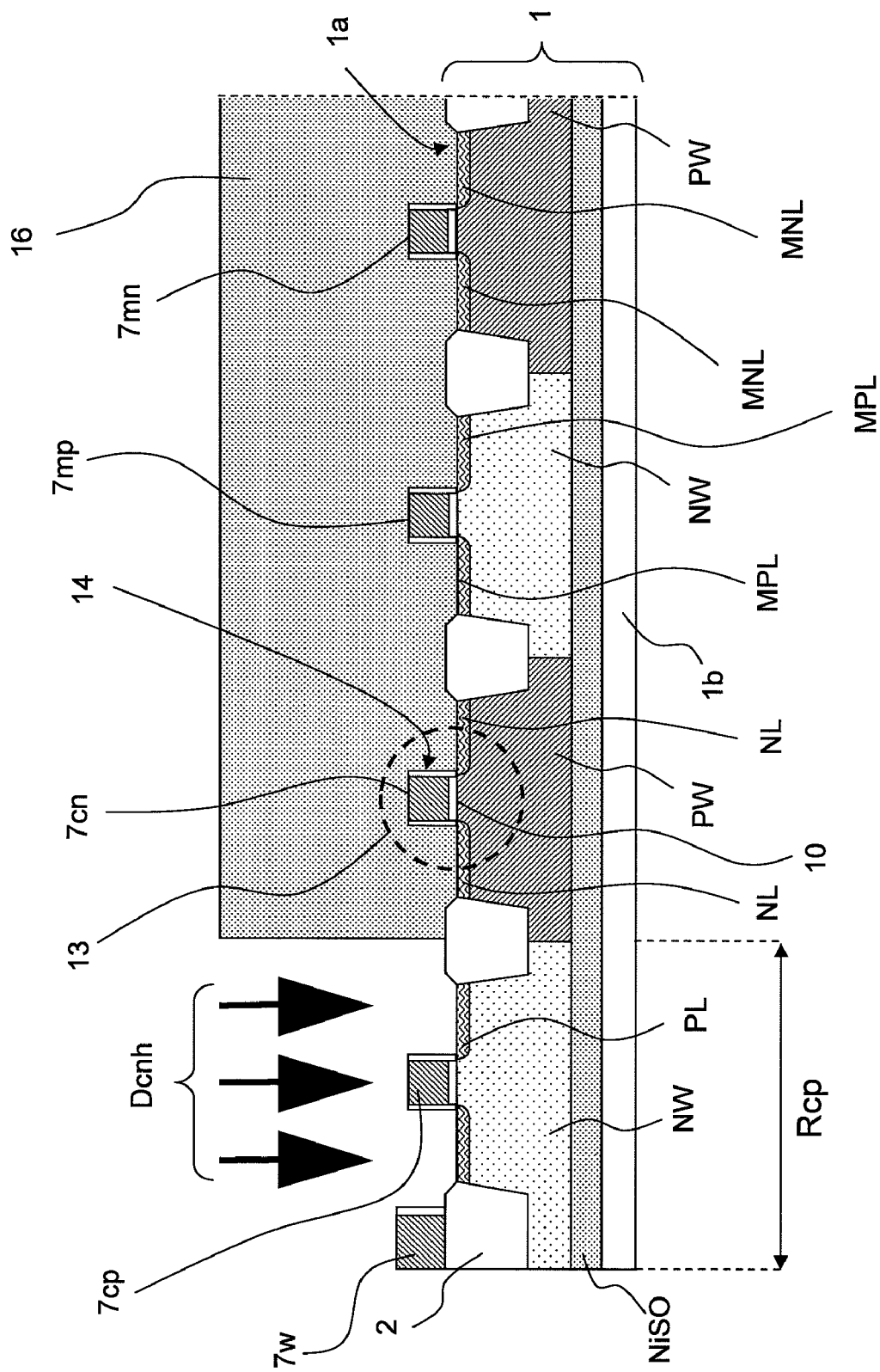
FIG. 13 is a sectional view of the device in the wafer process (n-type halo implantation step into the p-channel MISFET having a low operating voltage) in the manufacturing method for the semiconductor integrated circuit device according to the embodiment of the present application.
Figure 14:
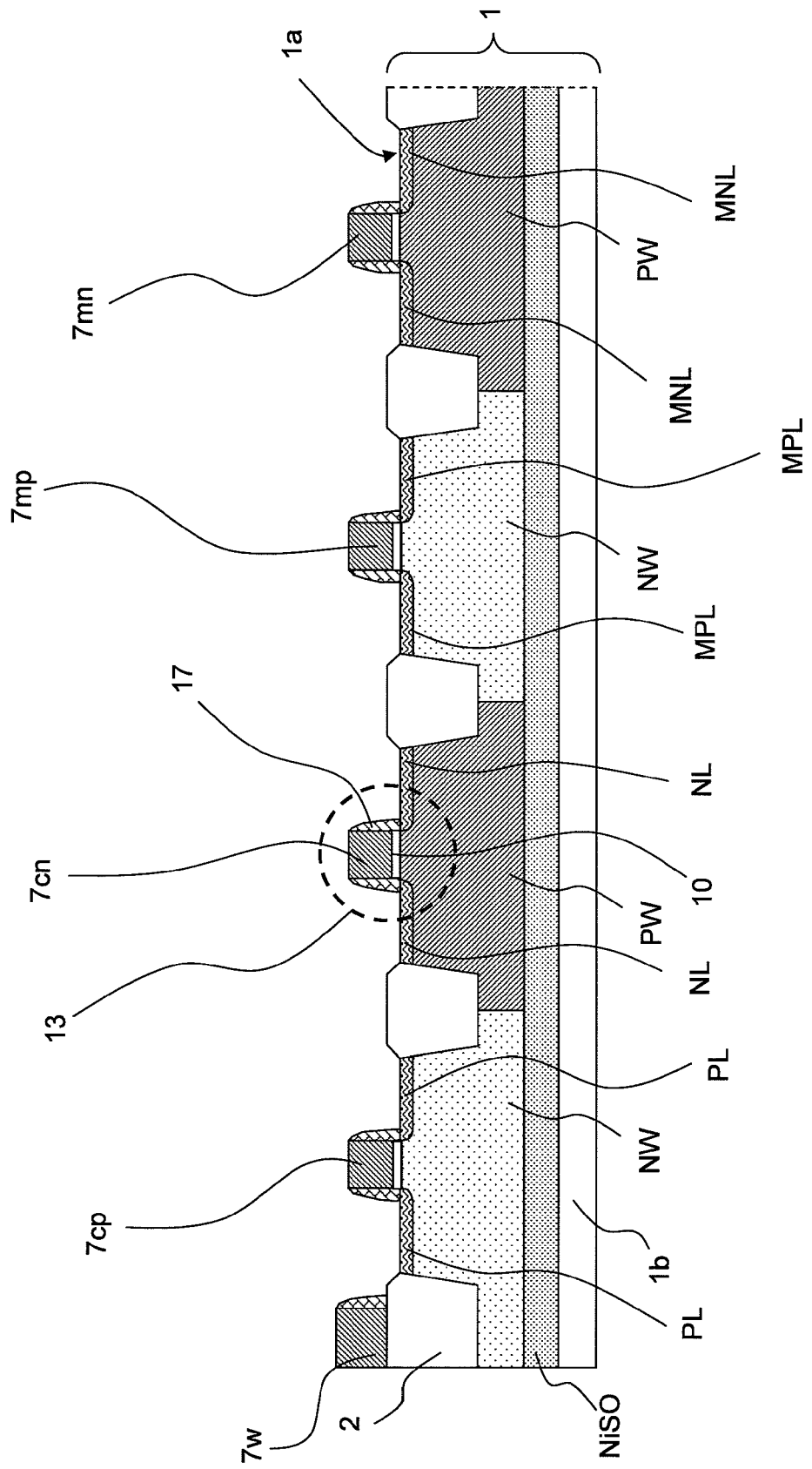
FIG. 14 is a sectional view of the device in the wafer process (side wall formation step) in the manufacturing method for the semiconductor integrated circuit device according to the embodiment of the present application.
Figure 15:
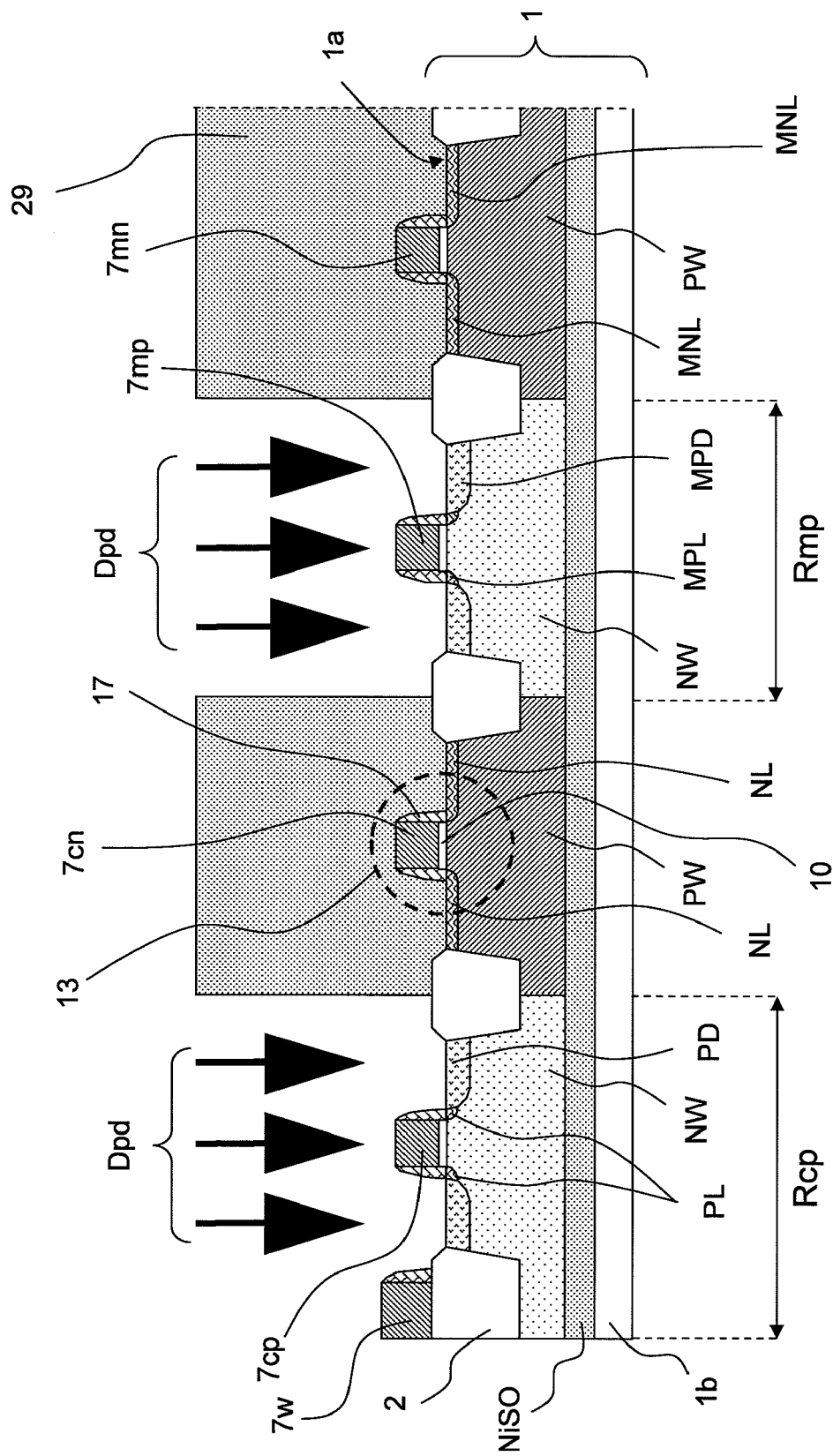
FIG. 15 is a sectional view of the device in the wafer process (heavily-doped source/drain-region ion implantation step into the p-channel MISFETs having low and intermediate operating voltages) in the manufacturing method for the semiconductor integrated circuit device according to the embodiment of the present application.
Figure 16:
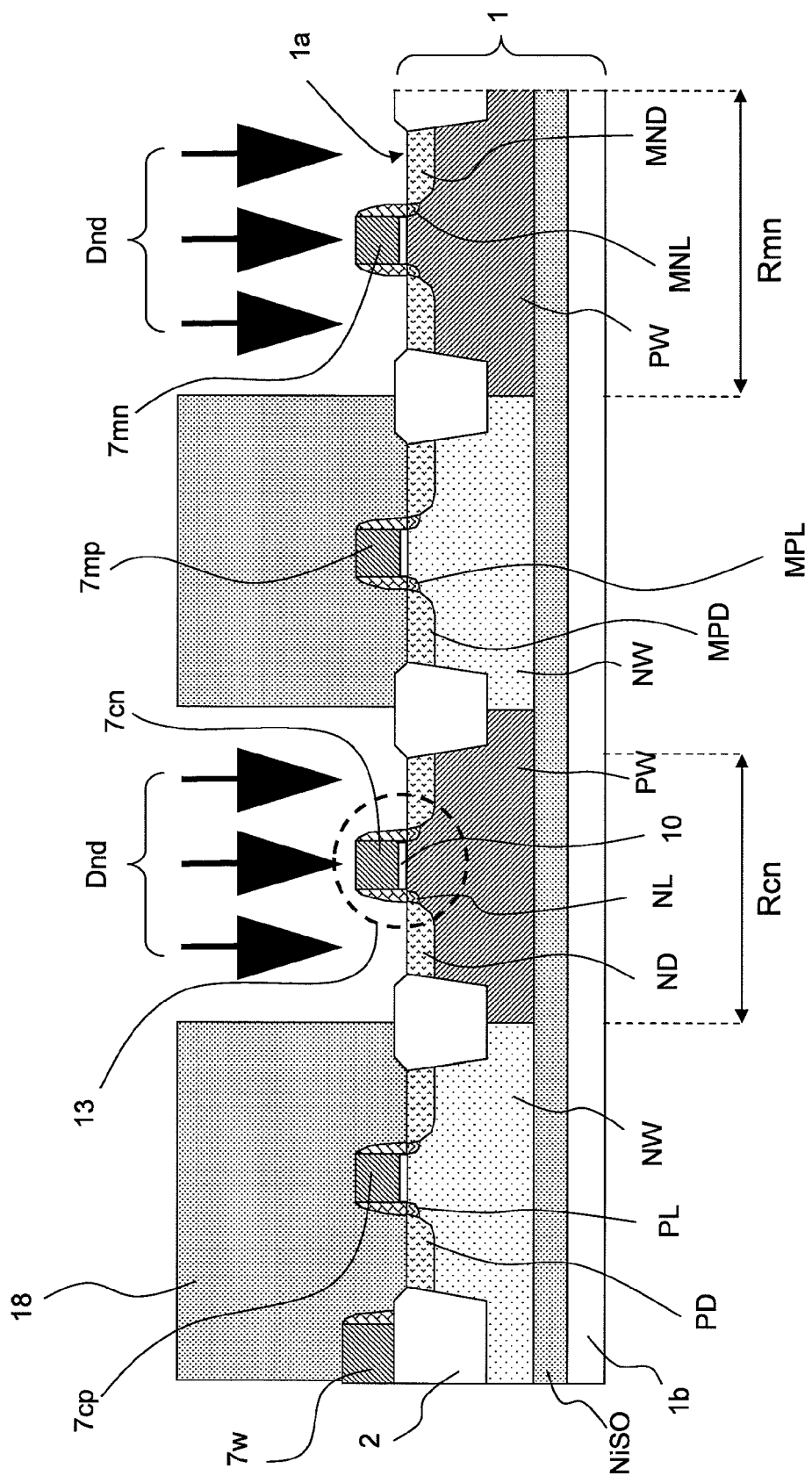
FIG. 16 is a sectional view of the device in the wafer process (heavily-doped source/drain-region ion implantation step into the n-channel MISFETs having low and intermediate operating voltages) in the manufacturing method for the semiconductor integrated circuit device according to the embodiment of the present application.
Figure 17:
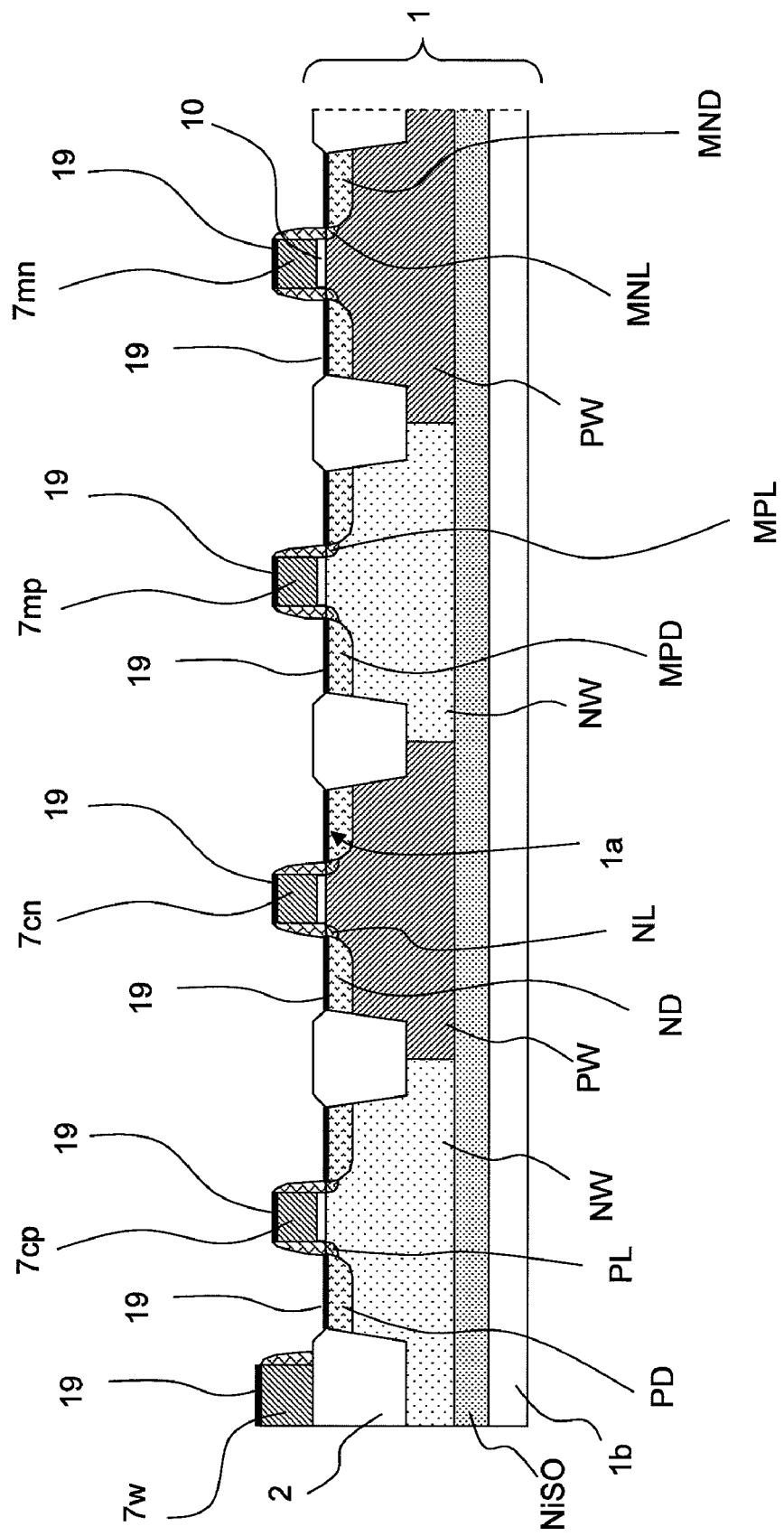
FIG. 17 is a sectional view of the device in the wafer process (salicide step) in the manufacturing method for the semiconductor integrated circuit device according to the embodiment of the present application.
Figure 18:
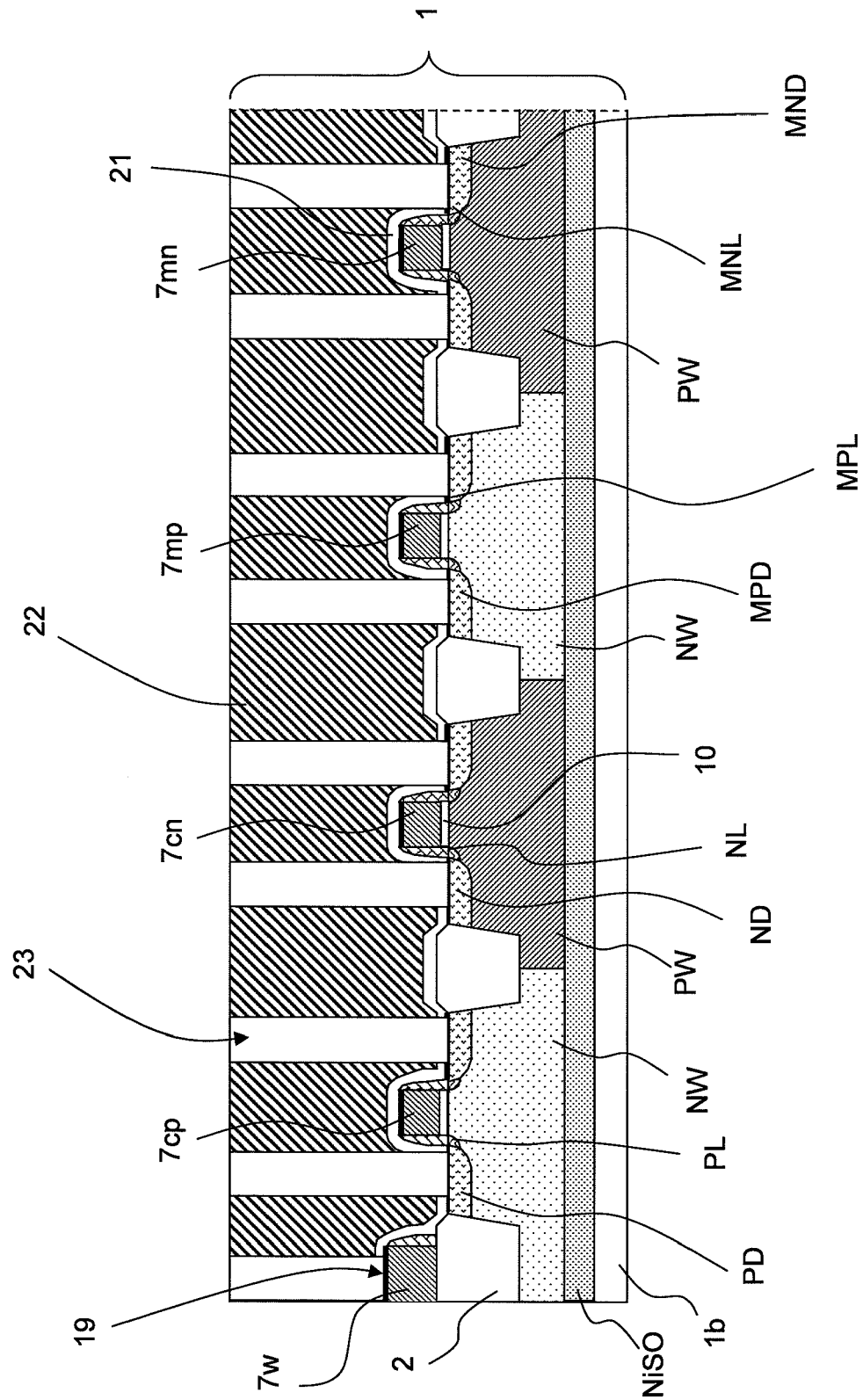
FIG. 18 is a sectional view of the device in the wafer process (contact hole formation step) in the manufacturing method for the semiconductor integrated circuit device according to the embodiment of the present application.
Figure 19:
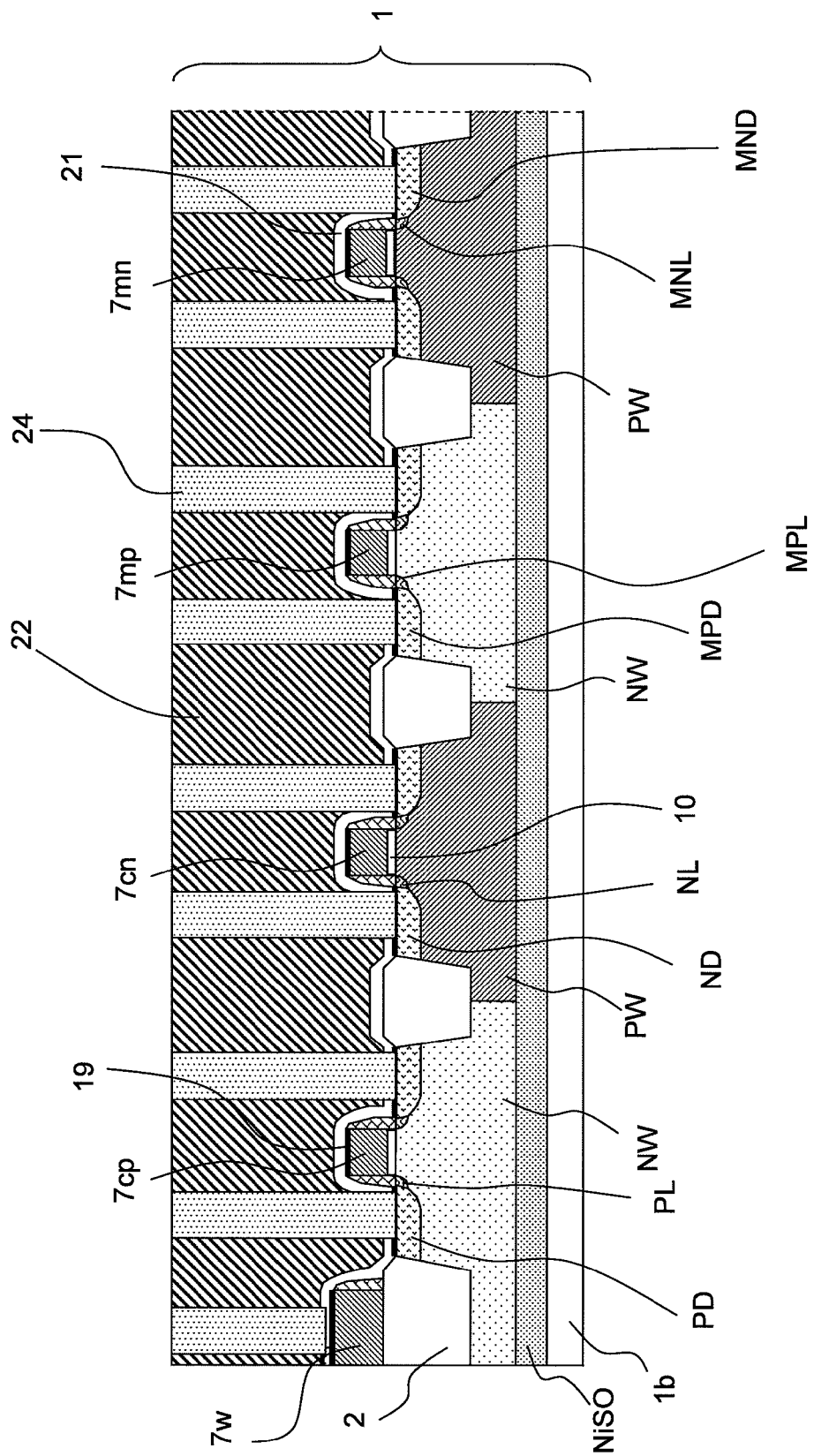
FIG. 19 is a sectional view of the device in the wafer process (tungsten plug formation step) in the manufacturing method for the semiconductor integrated circuit device according to the embodiment of the present application.
Figure 20:
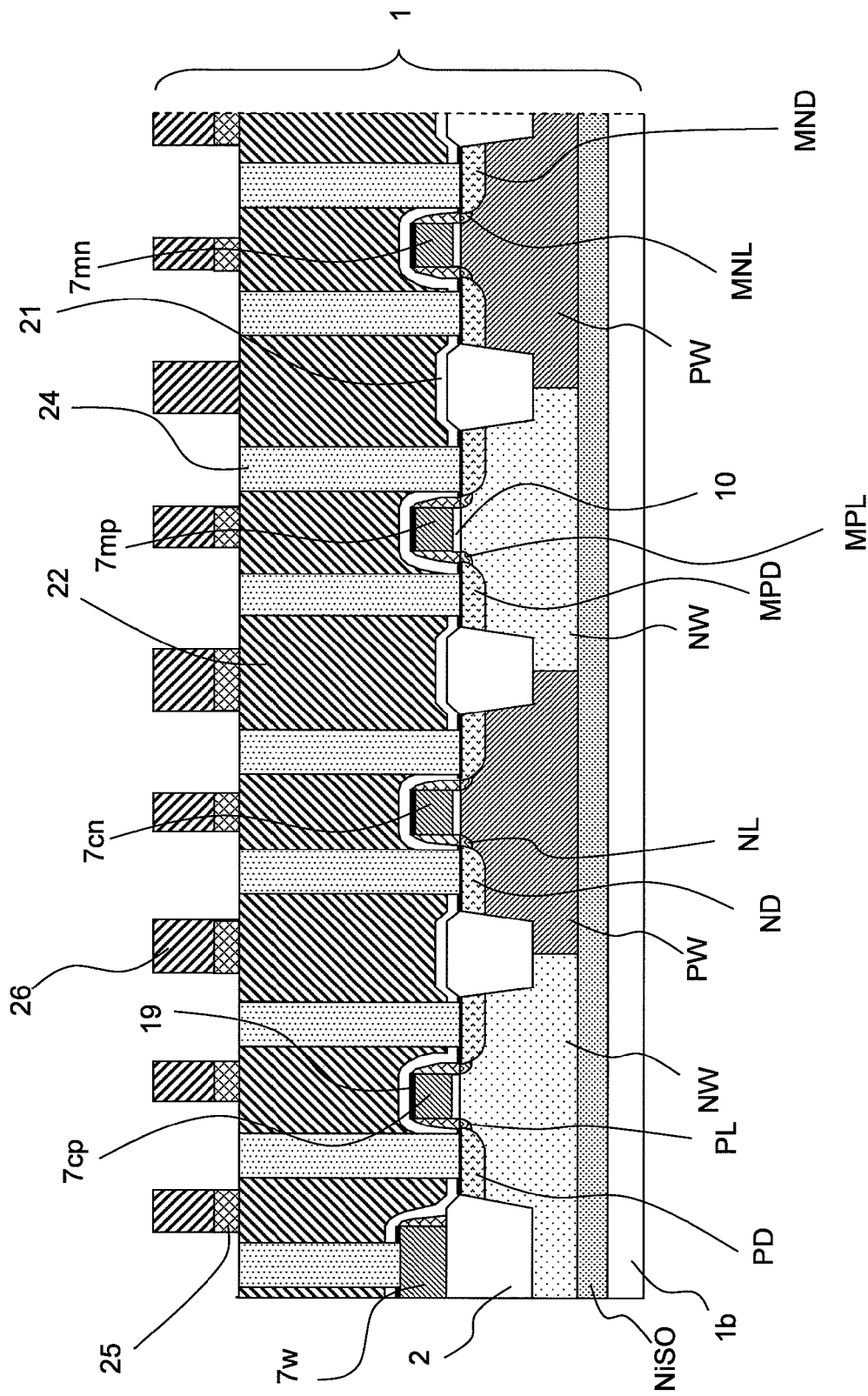
FIG. 20 is a sectional view of the device in the wafer process (M1 damascene interconnect trench formation step) in the manufacturing method for the semiconductor integrated circuit device according to the embodiment of the present application.
Figure 21:
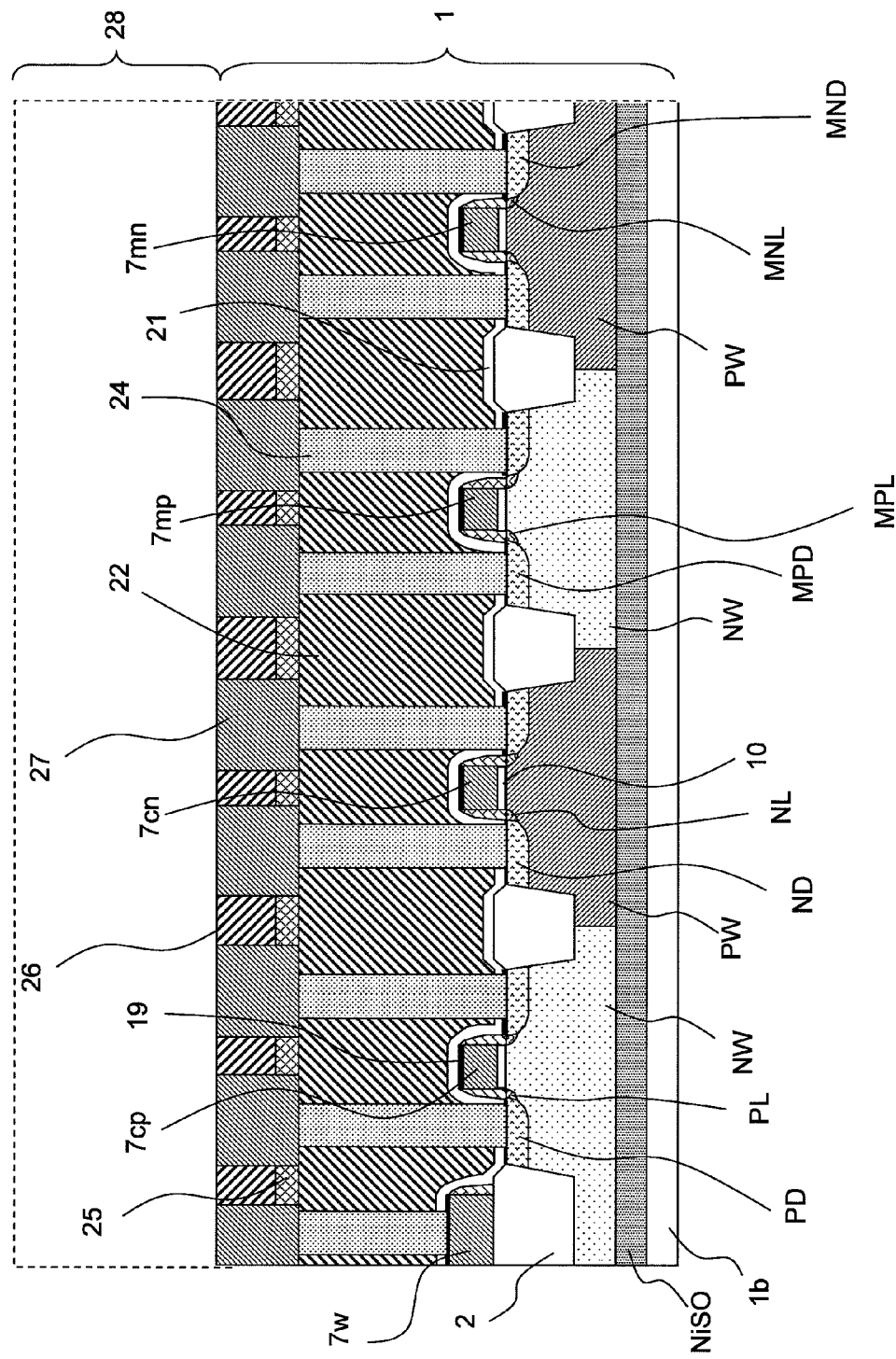
FIG. 21 is a sectional view of the device in the wafer process (M1 damascene interconnect formation step) in the manufacturing method for the semiconductor integrated circuit device according to the embodiment of the present application.

FIG. 1 is a sectional view of a semiconductor integrated circuit device in a wafer process (p-well ion implantation step) in the manufacturing method for the semiconductor integrated circuit device according to one embodiment of the present application. FIG. 2 is a sectional view of the device in the wafer process (threshold voltage adjustment ion implantation step at n-channel MISFET) in the manufacturing method for the semiconductor integrated circuit device according to the embodiment of the present application. FIG. 3 is a sectional view of the device in the wafer process (n-well ion implantation step) in the manufacturing method for the semiconductor integrated circuit device according to the embodiment of the present application. FIG. 4 is a sectional view of the device in the wafer process (threshold voltage adjustment ion implantation step into the p-channel MISFET) in the manufacturing method for the semiconductor integrated circuit device according to the embodiment of the present application. FIG. 5 is a sectional view of the device in the wafer process (polysilicon coating step) in the manufacturing method for the semiconductor integrated circuit device according to the embodiment of the present application. FIG. 6 is a sectional view of the device in the wafer process (p-type impurity ion implantation step into the polysilicon film) in the manufacturing method for the semiconductor integrated circuit device according to the embodiment of the present application. FIG. 7 is a sectional view of the device in the wafer process (n-type impurity ion implantation step into the polysilicon film) in the manufacturing method for the semiconductor integrated circuit device according to the embodiment of the present application. FIG. 8 is a sectional view of the device in the wafer process (gate electrode patterning and implantation step) in the manufacturing method for the semiconductor integrated circuit device according to the embodiment of the present application. FIG. 9 is a sectional view of the device in the wafer process (ion implantation step into a LDD region of the n-channel MISFET having the intermediate operating voltage) in the manufacturing method for the semiconductor integrated circuit device according to the embodiment of the present application. FIG. 10 is a sectional view of the device in the wafer process (ion implantation step into a LDD region of the p-channel MISFET having the intermediate operating voltage) in the manufacturing method for the semiconductor integrated circuit device according to the embodiment of the present application. A main part 13 shown in FIGS. 10 to 16 is illustrated in detail in FIGS. 22 to 29. FIG. 11 is a sectional view of the device in the wafer process (offset spacer forming step) in the manufacturing method for the semiconductor integrated circuit device according to the embodiment of the present application. FIG. 12 is a sectional view of the device in the wafer process (p-type halo implantation step into the n-channel MISFET having the low operating voltage) in the manufacturing method for the semiconductor integrated circuit device according to the embodiment of the present application. FIG. 13 is a sectional view of the device in the wafer process (n-type halo implantation step into the p-channel MISFET having the low operating voltage) in the manufacturing method for the semiconductor integrated circuit device according to the embodiment of the present application. FIG. 14 is a sectional view of the device in the wafer process (side wall formation step) in the manufacturing method for the semiconductor integrated circuit device according to the embodiment of the present application. FIG. 15 is a sectional view of the device in the wafer process (heavily-doped source/drain-region ion implantation step into the p-channel MISFET having low and intermediate operating voltages) in the manufacturing method for the semiconductor integrated circuit device according to the embodiment of the present application. At this time, the heavily-doped source/drain-region ion implantation into the p-channel MISFET having the high operating voltage is simultaneously performed. FIG. 16 is a sectional view of the device in the wafer process (heavily-doped source/drain-region ion implantation step into the n-channel MISFETs having low and intermediate operating voltages) in the manufacturing method for the semiconductor integrated circuit device according to the embodiment of the present application. At this time, the heavily-doped source/drain-region ion implantation into the n-channel MISFET having the high operating voltage is simultaneously performed. FIG. 17 is a sectional view of the device in the wafer process (salicide step) in the manufacturing method for the semiconductor integrated circuit device according to the embodiment of the present application. FIG. 18 is a sectional view of the device in the wafer process (contact hole formation step) in the manufacturing method for the semiconductor integrated circuit device according to the embodiment of the present application. FIG. 19 is a sectional view of the device in the wafer process (tungsten plug formation step) in the manufacturing method for the semiconductor integrated circuit device according to the embodiment of the present application. FIG. 20 is a sectional view of the device in the wafer process (M1 damascene interconnect trench formation step) in the manufacturing method for the semiconductor integrated circuit device according to the embodiment of the present application. FIG. 21 is a sectional view of the device in the wafer process (M1 damascene interconnect formation step) in the manufacturing method for the semiconductor integrated circuit device according to the embodiment of the present application. Based on the above description, a process flow of the wafer process in the manufacturing method for the semiconductor integrated circuit device according to the embodiment of the present application will be described below.

First, the outline of a process flow in a wafer process introduction stage will be described below with reference to FIG. 1. A silicon nitride film is formed by CVD over a thermally-oxidized film formed over a device main surface $1a$ (first main surface) of a semiconductor wafer, that is, a p-type single crystal silicon substrate 1, $1b$ (which is, for example, a 300 phi wafer, but may be a wafer of 450φ or less than 300φ), and then patterned by normal lithography so as to leave a part of the silicon nitride film located over an active region (a region where the element is mainly formed). Element separation trenches for shallow trench isolation (STI) are formed on the first main surface $1a$ of the substrate 1 by dry etching, using the patterned silicon nitride film as a mask. Subsequently, after a CVD silicon oxide film 2 is formed over the entire surface of the substrate, reverse pattern etching for the following CMP is performed by a black and white reverse resist pattern of the trench etching for the STI. The first main surface $1a$ is flattened by a chemical mechanical polishing (CMP) process to leave a field insulating film 2 in the trench. The field insulating film 2 embedded in the element separation trench for the STI forms the element separation region for defining a plurality of active regions. Thereafter, n-type impurities are ion-implanted to form an n-type deep well region NiSO (n-type buried well region or n-type buried isolation region) having a relatively low concentration of impurities over the entire surface or a predetermined part of the substrate.

Then, as shown in FIG. 1, a p-channel device region Rcp of a core device region Rc, and a p-channel device region Rmp of an intermediate operating voltage device region Rm (region for forming the intermediate operating voltage I/O device) over the device main surface $1a$ of the wafer 1 is coated with a resist film 3 by the normal lithography (for example, by optical lithography by means of an ArF ultraviolet light source and an immersion reduced projection exposure device using, for example, a positive type or a negative type photoresist or the like). In this state, ion implantation Dpw of p-type impurities into the n-channel device region Rcn of the core device region Rc and the n-channel device region Rmn of the intermediate operating voltage device region Rm is performed from the device main surface $1a$ side of the wafer 1 so as to form a p-well region PW. Thereafter, the resist film 3 is removed.

Then, as shown in FIG. 2, the entire area except for the n-channel device region Rcn of the low operating voltage device region Rc is coated with a resist film 4 by the normal lithography. In this state, ion implantation Dcnv of impurities into the n-channel device region Rcn having a low operating voltage is performed from the device main surface $1a$ side of the wafer 1 so as to adjust the Vth of then-channel MISFET. Therefore, the resist film 4 is removed.

Then, as shown in FIG. 3, the entire area other than the p-channel device region Rcp of the core device region Rc and the p-channel device region Rmp of the intermediate operating voltage device region Rm on the device main surface $1a$ of the wafer 1 is coated with the resist film 5 by the normal lithography. In this state, ion implantation Dnw of n-type impurities into a p-channel device region Rcp of the core device region Rc and a p-channel device region Rmp of the intermediate operating voltage device region Rm is performed from a device main surface $1a$ side of the wafer 1 so as to form an n-well region NW. Thereafter, the resist film 5 is removed.

Then, as shown in FIG. 4, the entire area other than a p-channel device region Rcp of the low operating voltage device region Rc is coated with the resist film 6 by the normal lithography. In this state, ion implantation Dcpv of impurities into the p-channel device region Rcp having the low operating voltage is performed from the device main surface $1a$ side of the wafer 1 so as to adjust the Vth of the p-channel MISFET. Then, the resist film 6 is removed. Further, well annealing is performed so as to activate and diffuse the impurities doped by the well implantation or the like.

Then, as shown in FIG. 5, the device main surface $1a$ of the wafer 1 is thermally oxidized to form a gate oxide film 10 (gate insulating film). Specifically, the following processing is performed so as to make a gate insulating film of the intermediate operating voltage device region Rm thicker than a gate insulating film of the low operating voltage device region Rc. First, after thermally oxidizing the entire wafer, the intermediate operating voltage device region Rm is covered with a resist, and the gate insulating film of the low operating voltage device region Rc is removed by hydrofluoric acid. Thereafter, the entire wafer is thermally oxidized again to finally form a gate oxide film 10. In detail, for example, the thermal oxidation is performed in a wet atmosphere by a sheet lamp furnace. After forming the gate oxide film 10, an azotizing process, such as a plasma azotizing process, is performed, and then annealing is performed after the azotizing process. After the annealing is performed after the azotizing process (for example, directly after the annealing performed after the azotizing process), Tg is measured before forming a next polysilicon film 7, if necessary. The measurement of a thickness of the gate oxide film 10 is optically measured, for example, using a measurement pattern measuring 50 micrometers square on a product wafer (note that the target value at this time is about 2.1 nm). The thickness of the gate oxide film is measured again by electrically evaluating CV characteristics in completion of the device (note that the target value at this time is about 2.5 nm).

Thereafter, a polysilicon film 7 (which may be made of amorphous silicon) serving as a gate electrode is formed by the CVD method. The thickness of the polysilicon 7 is, for example, about 140 nm.

Then, as shown in FIG. 6, the polysilicon film 7 (the device main surface 1a of the wafer 1) except for the p-channel device region Rcp of the core device region Rc, and the p-channel device region Rmp of the intermediate operating voltage device region Rm is covered with a resist film 8 by the normal lithography. In this state, ion implantation Dpg for doping p-type impurities is performed into the polysilicon film 7 at the p-channel device region Rcp of the core device region Rc and the p-channel device region Rmp of the intermediate operating voltage device region Rm from the device main surface 1a side of the wafer 1. Thereafter, the resist film 8 is removed.

Then, as shown in FIG. 7, the polysilicon film 7 (the device main surface 1a of the wafer 1) except for the n-channel device region Rcn of the core device region Rc and the n-channel device region Rmn of the intermediate operating voltage device region Rm is covered with a resist film 9 by normal lithography. In this state, ion implantation Dng for doping n-type impurities is performed into the polysilicon film 7 at the n-channel device region Rcn of the core device region Rc and the n-channel device region Rmn of the intermediate operating voltage device region Rm from the device main surface 1a side of the wafer 1. Thereafter, the resist film 9 is removed.

Then, as shown in FIG. 8, the polysilicon film 7 is processed by the normal lithography thereby to provide gate electrodes 7cp, 7cn, 7mp, and 7nm, and a polysilicon wire 7w (or a resistance element) in the form of a field insulating film. After removing the resist film for processing of the gate electrodes, reoxidation process is performed for the purpose of trimming the shapes of the gate electrodes 7cp, 7cn, 7mp, and 7mn.

Then, as shown in FIG. 9, the drive main surface 1a of the wafer 1 except for the n-channel device region Rmn of the intermediate operating voltage device region Rm is covered with a resist film 11 by the normal lithography. In this state, ion implantation Dmn1 for doping n-type impurities is performed into the n-channel device region Rmn of the intermediate operating voltage device region Rm from the device main surface 1a side of the wafer 1 so as to form an n-type lightly doped drain (LDD) region of the n-channel MISFET, that is, an n-type extension region MNL.

Subsequently, large ion implantation for forming a p-type halo region (see FIGS. 25(a) to 25(c)), that is, a p-type pocket region in an internal area of the tip of the n-type extension region MNL of the n-channel MISFET is performed into the n-channel device region Rmn of the intermediate operating voltage device region Rm from the device main surface 1a of the wafer 1, using the resist film 11 as a mask for the ion implantation. Thereafter, the resist film 11 is removed.

Then, as shown in FIG. 10, the device main surface 1a of the wafer 1 except for the p-channel device region Rmp of the intermediate operating voltage device region Rm is covered with a resist film 12 by the normal lithography. In this state, ion implantation Dmp1 for doping p-type impurities is performed into the p-channel device region Rmp of the intermediate operating voltage device region Rm from the device main surface 1a side of the wafer 1 so as to form a p-type LDD region of a p-channel MISFET, that is, a p-type extension region MPL.

Subsequently, large ion implantation for forming an n-type halo region (see FIGS. 25(a) to 25(c)), that is, an n-type pocket region in an internal area of the tip of the p-type extension region MPL of the p-channel MISFET is performed into the p-channel device region Rmp of the intermediate operating voltage device region Rm from the device main surface 1a of the wafer 1, using the resist film 12 as a mask for the ion implantation. Thereafter, the resist film 12 is removed.

Then, as shown in FIG. 11, an insulating film 14 (whose thickness is, for example, about 13 nm) is formed substantially over the entire device main surface 1a of the wafer 1 by the CVD method. The insulating film 14 is etched back by anisotropic etching, so that offset spacer films 14 are finally formed over both side walls of each of the gate electrodes 7cp, 7cn, 7mp, and 7mn (see FIGS. 22 to 24 for the details of the process).

Then, as shown in FIG. 12, the substantially entire device main surface 1a of the wafer 1 except for the n-channel device region Rcn of the core device region Rc is covered with a resist film 15 by the normal lithography. In this state, ion implantation for doping n-type impurities is performed into the n-channel device region Rcn of the low operating voltage device region Rc from the device main surface 1a side of the wafer 1 so as to form an n-type LDD region of the n-channel MISFET, that is, the n-type extension region NL (for example, using As+ at an implantation energy of about 3.5 kev in the amount of doping of $1 \times 10^{15}$ cm$^{-2}$).

Subsequently, large ion implantation Dcph for forming a p-type halo region PH (see FIGS. 25(a) to 25(c)), that is, a p-type pocket region in an internal area of the tip of the n-type extension region NL of the n-channel MISFET is performed into the n-channel device region Rcn of the low operating voltage device region Rc from the device main surface 1a of the wafer 1, using the resist film 15 as a mask for the ion implantation (for example, using B+ at an implantation energy of about 10 kev in the amount of doping of $3.8 \times 10^{13}$ cm$^{-2}$). Thereafter, the resist film 15 is removed. Then, annealing is performed for activating impurities that are nonactive to ion implantation.

Then, as shown in FIG. 13, the substantially entire device main surface 1a of the wafer 1 except for the p-channel device region Rcp of the core device region Rc is covered with a resist film 16 by the normal lithography. In this state, ion implantation for doping p-type impurities is performed into the p-channel device region Rcp of the low operating voltage device region Rc from the device main surface 1a side of the wafer 1 so as to form a p-type LDD region of the p-channel MISFET, that is, a p-type extension region PL (for example, using BF$_2$+ at an implantation energy of about 2.5 kev in the amount of doping of $3 \times 10^{14}$ cm$^{-2}$).

Subsequently, large ion implantation Dcnh for forming an n-type halo region NH (see FIGS. 25(a) to 25(c)), that is, an n-type pocket region in an internal area of the tip of the p-type extension region PL of the p-channel MISFET is performed into the p-channel device region Rcp of the low operating voltage device region Rc from the device main surface 1a of the wafer 1, using the resist film 16 as a mask for the ion implantation (for example, using phosphorus P+ at an implantation energy of about 30 kev in the amount of doping of $3.5 \times 10^{13}$ cm$^{-2}$). Thereafter, the resist film 16 is removed.

Then, as shown in FIG. 14, an insulating film 17 is formed substantially over the entire device main surface 1a of the wafer 1 by the CVD method. Specifically, the insulating film is composed of, for example, an ozone TEO film (of about 10 nm in thickness) as a lower layer, and a silicon nitride film (of about 45 nm in thickness) as an upper layer. The insulating film 17 is etched back by an isotropic etching, so that side walls 17 combined with the offset spacer films 14 are finally formed over both side walls of each of the gate electrodes 7cp, 7cn, 7mp, and 7mn (see FIGS. 27 and 28 for the details of the process).

Then, as shown in FIG. 15, the entire device main surface 1a of the wafer 1 except for the p-channel device region Rcp of the core device region Rc and the p-channel device region Rmp of the intermediate operating voltage device region Rm is covered with a resist film 29 by the normal lithography. In this state, ion implantation Dpd for doping p-type impurities is performed into the p-channel device region Rcp of the core device region Rc and the p-channel device region Rmp of the intermediate operating voltage device region Rm from the device main surface 1a side of the wafer 1 so as to form a heavily doped p-type source/drain region PD (for example, using B+ at an implantation energy of about 2 kev in the amount of doping of $4 \times 10^{15}$ cm$^{-2}$). Thereafter, the resist film 29 is removed.

Then, as shown in FIG. 16, the device main surface 1a of the wafer 1 except for the n-channel device region Rcn of the core device region Rc and the n-channel device region Rmn of the intermediate operating voltage device region Rm is covered with a resist film 18 by the normal lithography. In this state, ion implantation Dnd for doping n-type impurities is performed into the n-channel device region Rcn of the core device region Rc and the n-channel device region Rmn of the intermediate operating voltage device region Rm from the device main surface 1a side of the wafer 1 so as to form a heavily doped n-type source/drain region ND (for example, in two stages, using As+ at an implantation energy of about 20 kev in the amount of doping of $4 \times 10^{14}$ cm$^{-2}$ and subsequently using P+ at an implantation energy of about 10 kev in the amount of doping of $5 \times 10^{14}$ cm$^{-2}$). Thereafter, the resist film 18 is removed.

Then, as shown in FIG. 17, a nickel silicide film 19 is formed over each of upper surfaces of the source/drain region and the gate electrodes 7cp, 7cn, 7mp, 7mn, and 7w by a salicide process. Actually, first, the nickel film is formed substantially over the entire device main surface 1a of the wafer 1 by sputtering coating. Subsequently, annealing is performed to cause silicon to react with nickel, thereby forming a silicide layer. Thereafter, an unnecessary part of the nickel film is removed. Further, necessary annealing is performed, which finally provides a nickel silicide film 19. Although the nickel silicide film is exemplified in this embodiment, the invention is not limited thereto. For example, other silicide films, such as a cobalt silicide film, can be applied.

Then, as shown in FIG. 18, a silicon nitride film 21 is formed substantially over the entire device main surface 1a of the wafer 1 by the plasma CVD method. Subsequently, a pre-metal interlayer insulating film 22 which is much thicker than the silicon nitride film 21 is formed over the silicon nitride film 21. The pre-metal interlayer insulating film 22 includes an ozone TEOS silicon oxide film formed by the high density plasma (HDP), and a TEOS silicon oxide film or the like formed by the plasma CVD method, which are arranged from the bottom in that order. Thereafter, the entire wafer other than parts for forming contact holes is coated with a resist film by the normal lithography. In the state, holes are formed to reach the upper surface of the silicon nitride film 21 by anisotropic dry etching using the silicon nitride film 21 as an etching stopper. The upper part of the wafer is once flattened by the CMP, and a TEOS silicon oxide film is formed again by the plasma CVD methods as a cap film. Thereafter, the resist film is removed, and the silicon nitride films 21 located at the bottoms of the holes are removed to obtain the contact openings 23.

Then, as shown in FIG. 19, a thin barrier metal layer made of TiN and the like is formed substantially over the entire device main surface 1a of the wafer 1 including inner surfaces of the contact openings 23. Specifically, the barrier metal layer is made of a titan layer as a lower layer, and a conductive film of TiN or the like as an upper layer. A plug 24 made of a conductive film, such as tungsten, is embedded over the barrier metal layer by the CVD method. An unnecessary part of the tungsten film is removed by planarization by means of metal CMP.

Then, as shown in FIG. 20, a M1 linear insulating film 25 constructed of a silicon oxide film (lower layer) and a SiCN film (upper layer) is formed substantially over the entire device main surface 1a of the wafer 1 by the plasma CVD method. Subsequently, a M1 interlayer main insulating film 26 (silicon oxide film formed by the plasma CVD method) which is much thicker than the M2 liner insulating film 25 is formed over the M1 liner insulating film 25. A M1 interlayer insulating film made of the M1 liner insulating film 25 and the M1 interlayer main insulating film 26 is processed by the normal lithography to form a wiring trench for a M1 copper embedded wiring.

Then, as shown in FIG. 21, a copper alloy layer 27 containing pure copper or copper as a principal component is formed over the device main surface 1a of the wafer 1 containing the wiring trenches by plating or the like. Specifically, a TaN/Ta film or a Ti/TiN film is formed as a barrier metal layer from the bottom side under a layer of copper or the like. Thereafter, the copper layer and the barrier metal layer located outside the wiring trenches are removed by the metal CMP method to finally provide an embedded copper wiring 27, which is a so-called damascene wiring.

Thereafter, a copper wiring layer 28 for a M2 wiring or later is formed by the so-called dual damascene method. (The interlayer film includes, for example, a liner film, a main interlayer insulating film, and a cap film in that order from the bottom, and specifically, the liner film consists of two layers, namely, a SiCN film of about 30 nm in thickness as a lower layer, and a SiCO film of about 30 nm in thickness as an upper layer. The main interlayer insulating film is a low-k film, for example, a SiOC film of about 350 nm in thickness. The cap film is, for example, a plasma TEOS film of about 80 nm in thickness.) A bonding pad containing aluminum alloy as a principal layer is formed over the last copper wiring. Last, a final passivation made of an inorganic insulating film or organic insulating film or the like with the bonding pad is formed.

3. Explanation of Main Details of Wafer Process of Low Operating Voltage N-Channel MISFET as Example in Manufacturing Method for Semiconductor Integrated Circuit Device According to One Embodiment of Present Application (see mainly FIGS. 22 to 29, and FIGS. 10 to 16).

Figure 22:
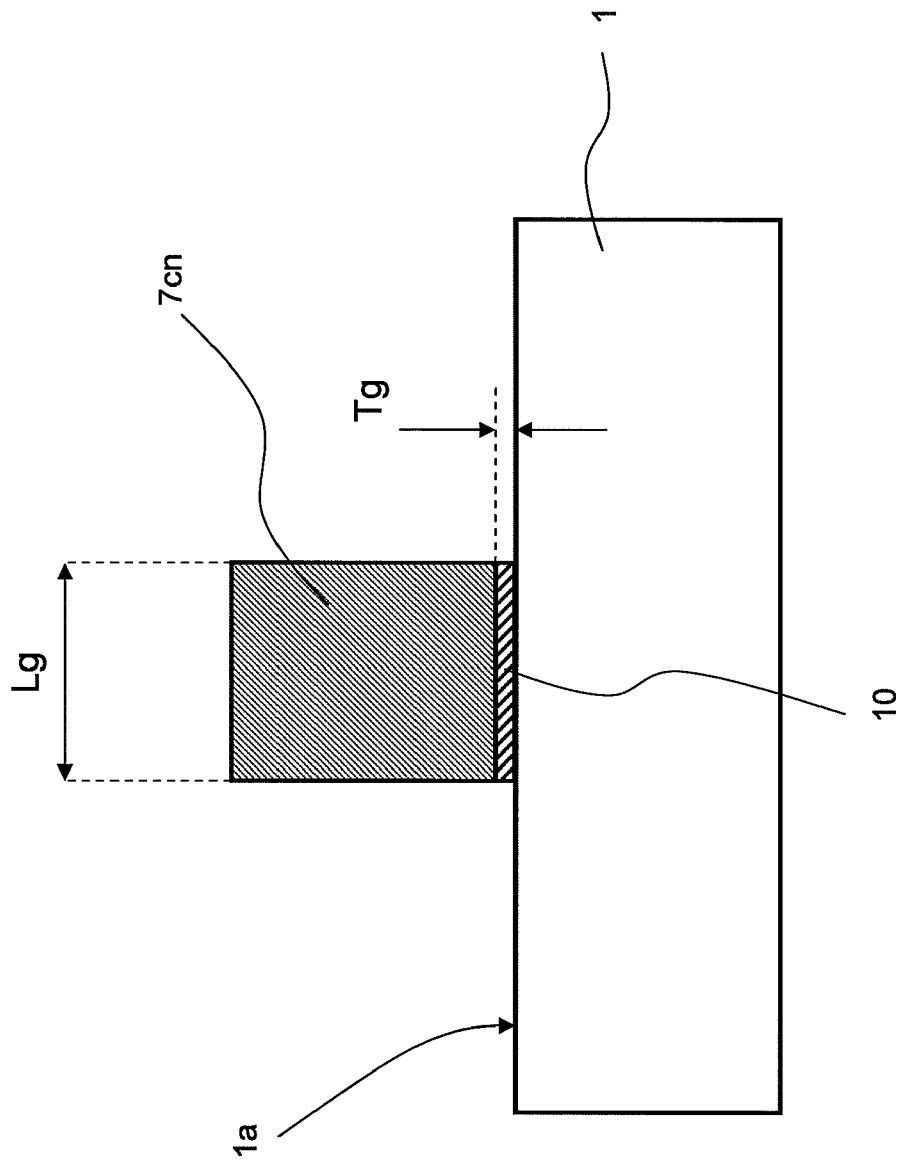
FIG. 22 is a sectional view of the device in the main details of the wafer process (gate electrode patterning step, corresponding to FIG. 8) of the low operating voltage n-channel MISFET as an example in the manufacturing method for the semiconductor integrated circuit device according to the embodiment of the present application.
Figure 23:
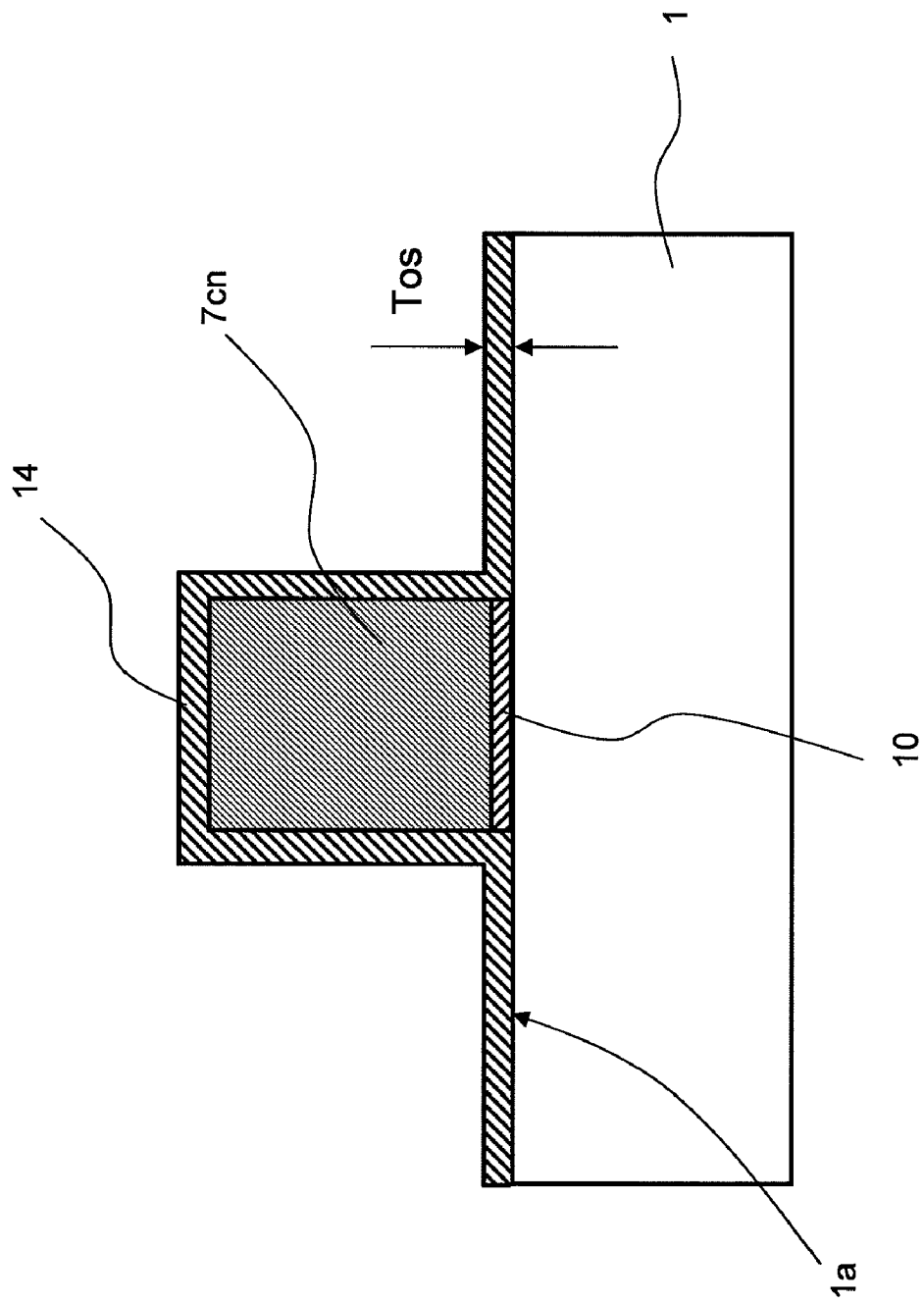
FIG. 23 is a sectional view of the device in the main details of the wafer process (offset spacer film-forming step, corresponding to FIG. 11) of the low operating voltage n-channel MISFET as an example in the manufacturing method for the semiconductor integrated circuit device according to the embodiment of the present application.
Figure 24:
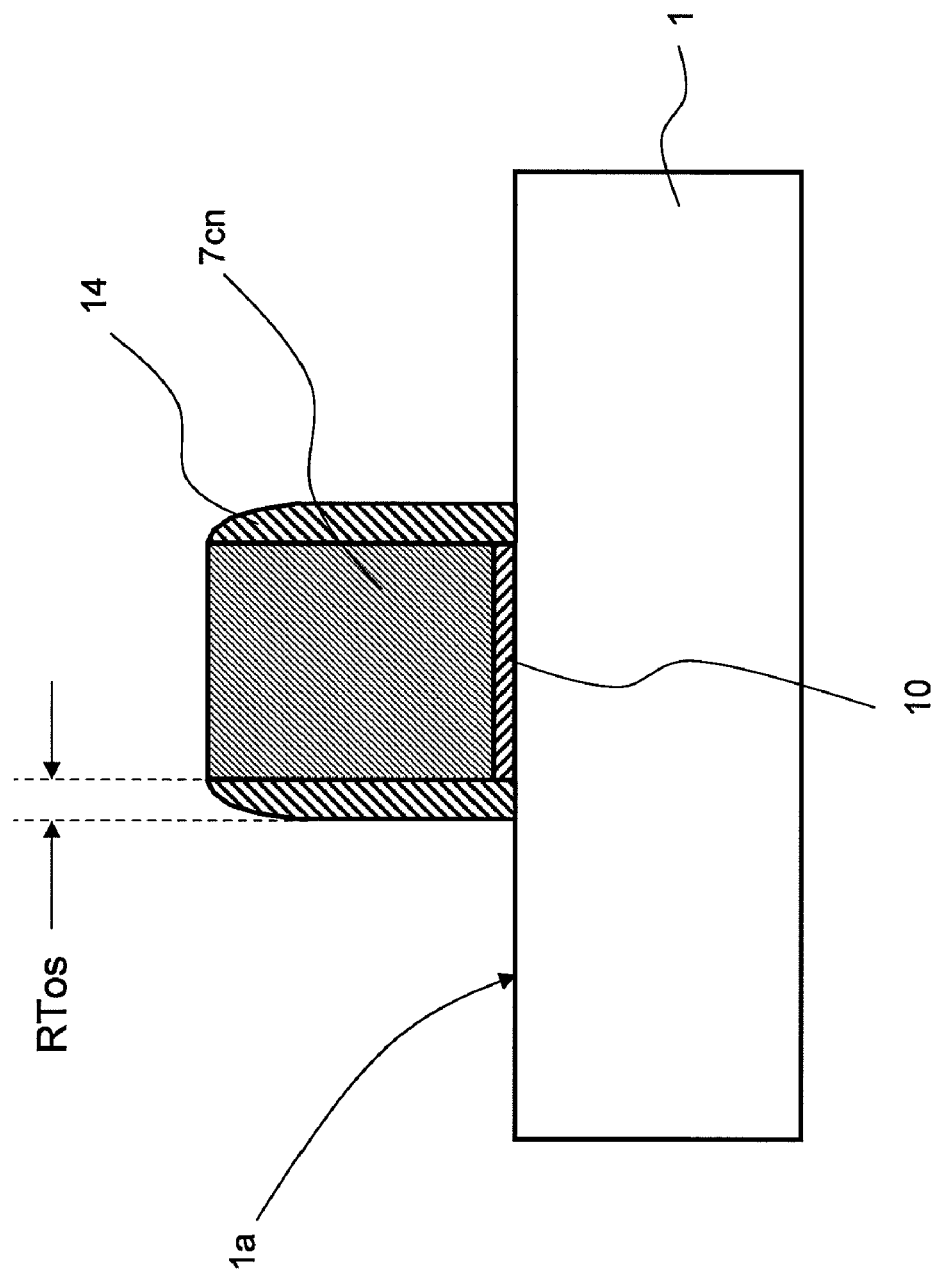
FIG. 24 is a sectional view of the device in the main details of the wafer process (offset spacer forming step, corresponding to FIG. 11) of the low operating voltage n-channel MISFET as an example in the manufacturing method for the semiconductor integrated circuit device according to the embodiment of the present application.
Figure 25:
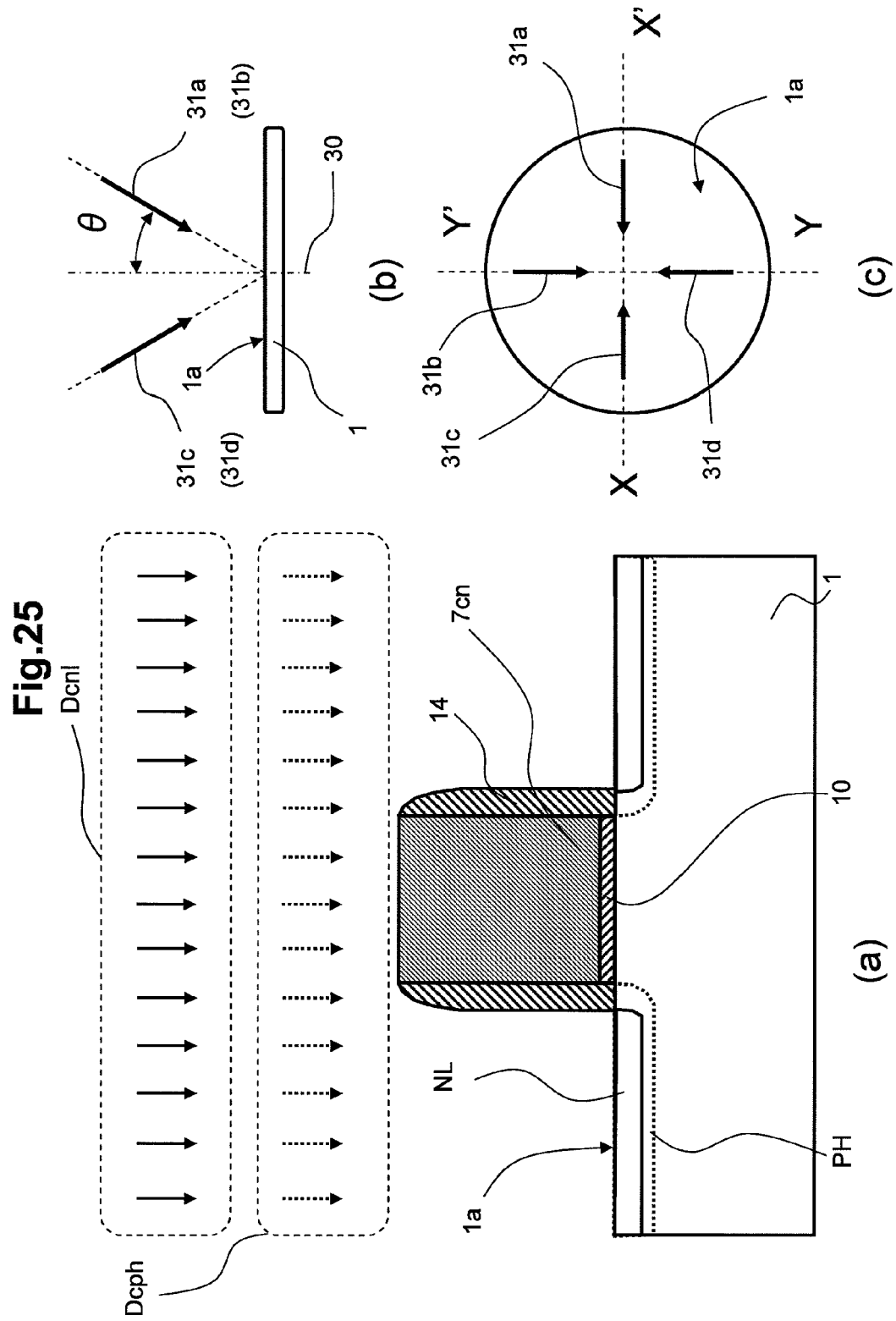
FIG. 25(a) to 25(c) are sectional views of the device in the main details of the wafer process (LDD and halo ion implantation step, corresponding to FIG. 12) of the low operating voltage n-channel MISFET as an example in the manufacturing method for the semiconductor integrated circuit device according to the embodiment of the present application.
Figure 26:
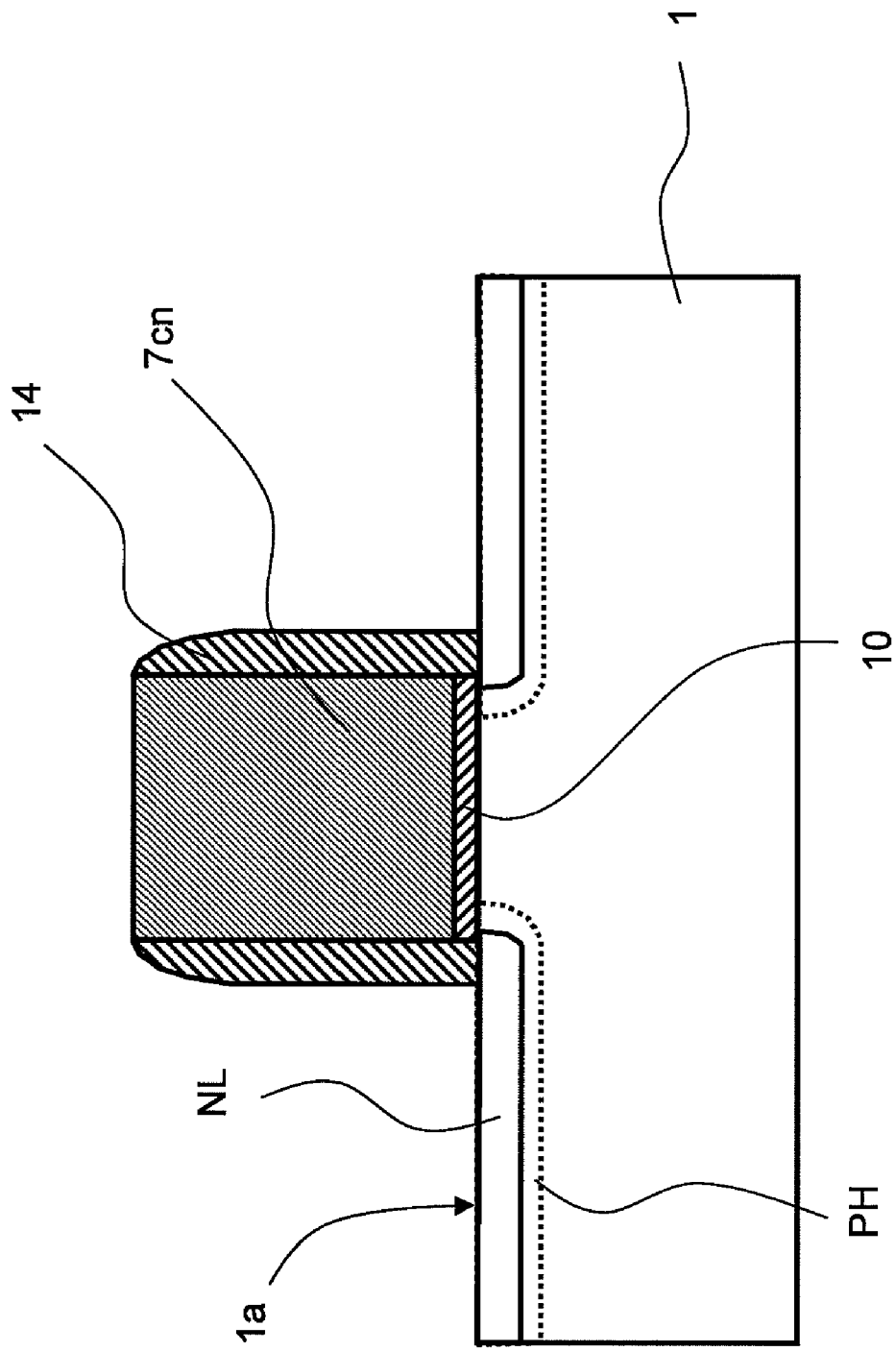
FIG. 26 is a sectional view of the device in the main details of the wafer process (annealing step after the LDD and halo ion implantation step, corresponding to FIG. 12) of the low operating voltage n-channel MISFET as an example in the manufacturing method for the semiconductor integrated circuit device according to the embodiment of the present application.
Figure 27:
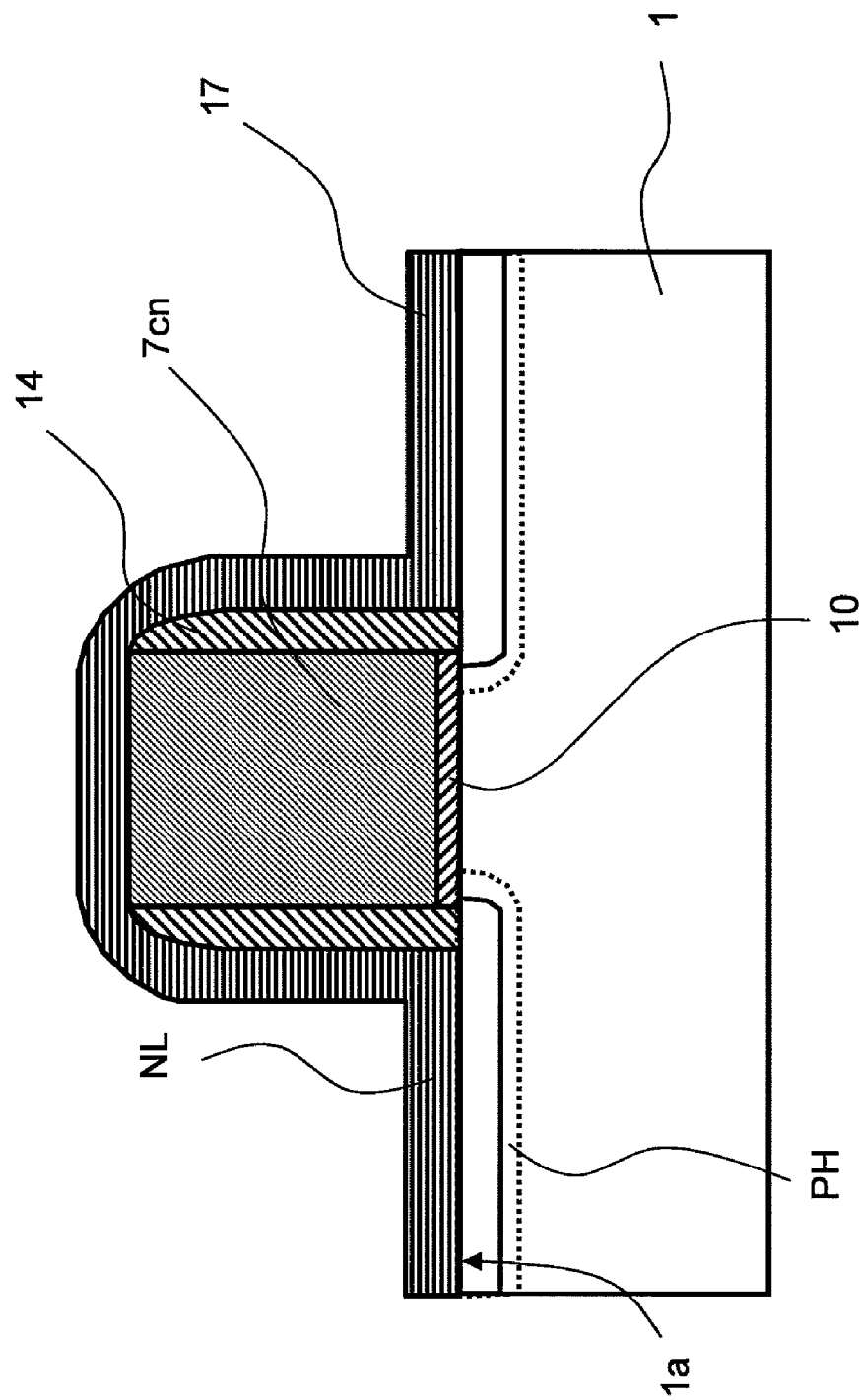
FIG. 27 is a sectional view of the device in the main details of the wafer process (side wall film-forming step, corresponding to FIG. 14) of the low operating voltage n-channel MISFET as an example in the manufacturing method for the semiconductor integrated circuit device according to the embodiment of the present application.
Figure 28:
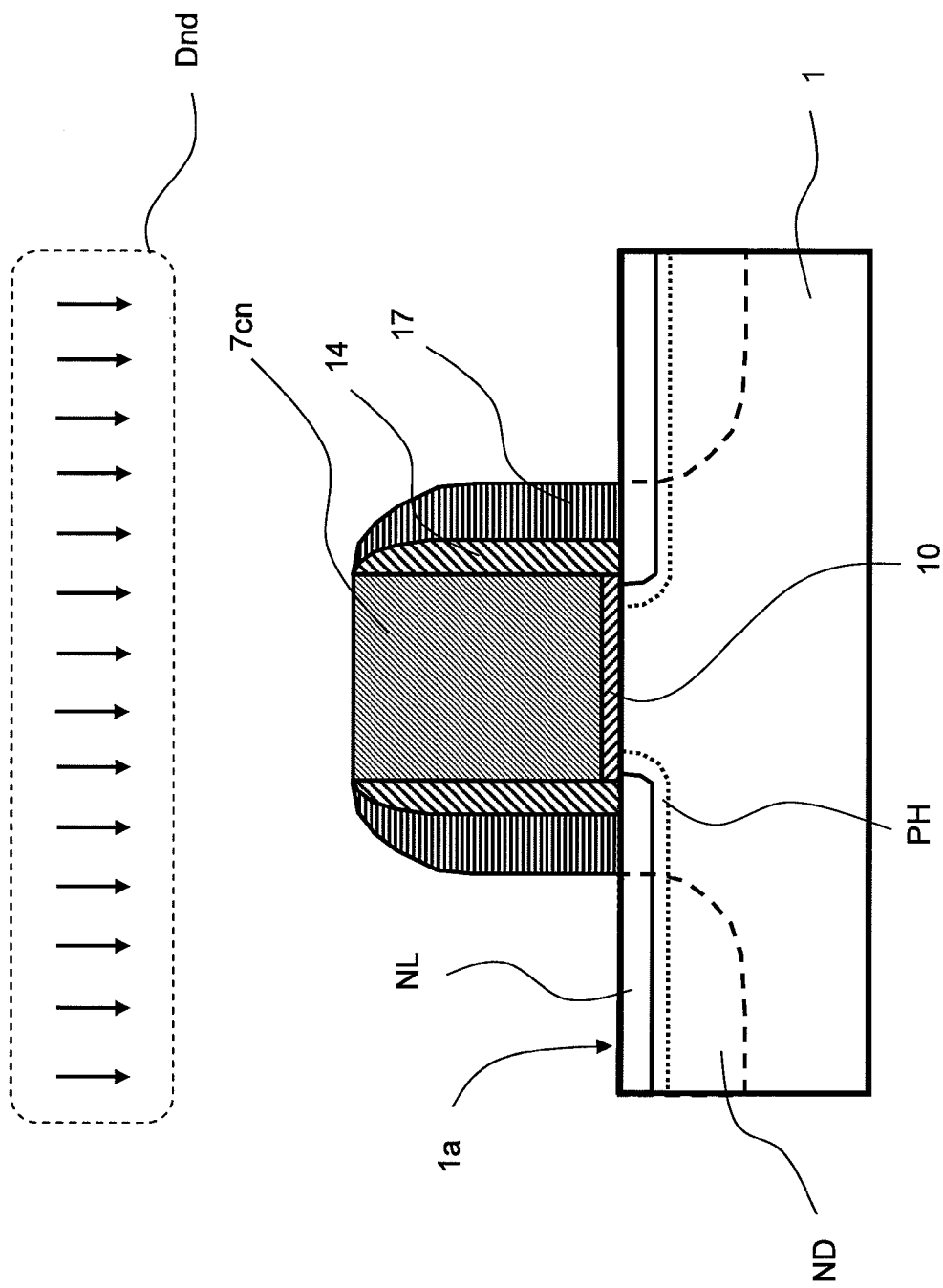
FIG. 28 is a sectional view of the device in the main details of the wafer process (side wall film-forming, and heavily doped source/drain ion implantation steps, respectively corresponding to FIGS. 14 and 16) of the low operating voltage n-channel MISFET as an example in the manufacturing method for the semiconductor integrated circuit device according to the embodiment of the present application.
Figure 29:
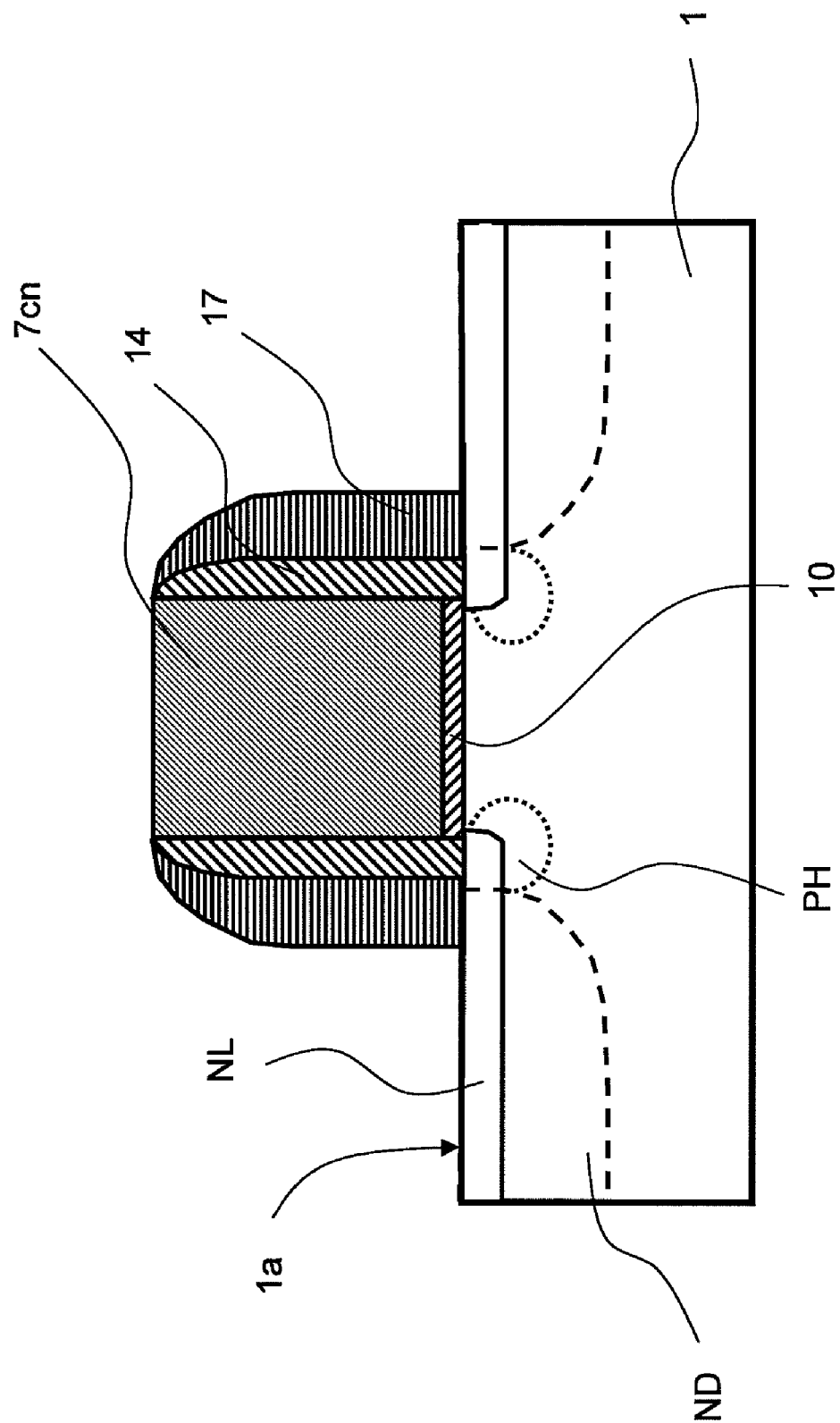
FIG. 29 is a sectional view of the device in the main details of the wafer process (thermal treatment step after the heavily doped source/drain ion implantation step, corresponding to FIG. 16 or the like) of the low operating voltage n-channel MISFET as an example in the manufacturing method for the semiconductor integrated circuit device according to the embodiment of the present application.

FIG. 22 is a sectional view of the device in the main details of the wafer process (a gate electrode patterning step, corresponding to FIG. 8) of the low operating voltage n-channel MISFET as an example in the manufacturing method for the semiconductor integrated circuit device according to one embodiment of the present application. FIG. 23 is a sectional view of the device in the main details of the wafer process (an offset spacer film-forming step, corresponding to FIG. 11) of the low operating voltage n-channel MISFET as an example in the manufacturing method for the semiconductor integrated circuit device according to one embodiment of the present application. FIG. 24 is a sectional view of the device in the main details of the wafer process (an offset spacer film-forming step, corresponding to FIG. 11) of the low operating voltage n-channel MISFET as an example in the manufacturing method for the semiconductor integrated circuit device according to one embodiment of the present application. FIGS. 25(a) to 25(c) (mainly, FIG. 25(a)) is a sectional view of the device in the main details of the wafer process (a LDD and halo ion implantation step, corresponding to FIG. 12) of the low operating voltage n-channel MISFET as an example in the manufacturing method for the semiconductor integrated circuit device according to one embodiment of the present application. FIG. 25B is a sectional view taken along the line X-X' or Y-Y' of FIG. 25(c). FIG. 26 is a sectional view of the device in the main details of the wafer process (annealing step after the LDD and halo ion implantation step, corresponding to FIG. 12) of the low operating voltage n-channel MISFET as an example in the manufacturing method for the semiconductor integrated circuit device according to one embodiment of the present application. FIG. 27 is a sectional view of the device in the main details of the wafer process (a side wall film-forming step, corresponding to FIG. 14) of the low operating voltage n-channel MISFET as an example in the manufacturing method for the semiconductor integrated circuit device according to one embodiment of the present application. FIG. 28 is a sectional view of the device in the main details of the wafer process (a side wall film-forming step, and ion implantation step for a heavily doped source/drain, corresponding to FIGS. 14 and 16) of the low operating voltage n-channel MISFET as an example in the manufacturing method for the semiconductor integrated circuit device according to the embodiment of the present application. FIG. 29 is a sectional view of the device in the main details of the wafer process (thermal treatment step after the heavily doped source/drain ion implantation step, corresponding to FIG. 16 or the like) of the low operating voltage n-channel MISFET as an example in the manufacturing method for the semiconductor integrated circuit device according to the embodiment of the present application. Based on these drawings, the details of the wafer process of the main portion 13 (see FIGS. 10 to 16) will be described below by taking the low operating voltage n-channel MISFET (MISFET having the intermediate Vth) as an example in the manufacturing method for the semiconductor integrated circuit device in the embodiment of the present application.

As shown in FIG. 22 (corresponding to FIG. 8), the gate electrode 7cn is formed by dry etching using the resist film as the mask. Thereafter, the resist film is removed. Then, the gate length Lg is measured by an optical, electron optical, or mechanical measuring method or the like, such as a length measurement scanning electron microscope (SEM) or an atomic force microscope (AFM). The gate length Lg is a representative Vth variation factor parameter. Other important Vth variation factor parameter may include the thickness of the gate insulating film 10, that is, the gate insulating film thickness Tg. The gate insulating film thickness Tg is measured by an optical method, such an ellipsometer or the like, after forming the gate insulating film 10 (see FIG. 5).

Then, as shown in FIG. 23 (corresponding to FIG. 11), a TEOS silicon oxide film 14 (offset spacer film) is formed substantially over the entire device main surface 1a of the wafer 1 containing the upper surface of the gate electrode 7cn by low-pressure CVD. Thereafter, the thickness of a flattened portion of the TEOS silicon oxide film 14 is optically measured, and the measured thickness is set as an offset spacer thickness Tos (measured value). This thickness corresponds substantially to the actual offset spacer thickness RTos (see FIG. 24).

Subsequently, as shown in FIG. 24 (corresponding to FIG. 11), the silicon oxide film 14 is etched back by anisotropic etching to provide an offset spacer film 14.

Then, as shown in FIGS. 25(a) to 25(c) (corresponding to FIG. 12), the substantially entire main surface 1a of the wafer 1 except for an n-channel device region Rcn of the core device region Rc is coated with a resist film 15. In this state, ion implantation Dcnl for doping n-type impurities is performed into the n-channel device region Rcn of the low operating voltage device region Rc from the device main surface 1a side of the wafer 1 so as to form the n-type LDD region of the n-channel MISFET, that is, the n-type extension region NL.

Subsequently, large angle ion implantation Dcph for forming the p-type halo region PH, that is, the p-type pocket region in the internal region of the tip end of the n-type extension region NL of the n-channel MISFET is performed into the n-channel device region Rcn of the low operating voltage device region Rc from the device main surface 1a of the wafer 1, using the resist film 15 as a mask for the ion implantation. The halo implantation as explained herein slightly differs from the normal ion implantation (for example, ion plantation Dcnl). The normal ion implantation is performed substantially vertically (vertically or at an inclination angle of 10 degrees or less) to a substrate surface 1a, while halo implantation is performed so as to be finally performed into the inside of a semiconductor layer under the end of the gate electrode 7cn. As shown in FIGS. 25B and 25(c), inclination beams 31a, 31b, 31c, and 31d each of which an inclination angle θ from the vertical axis 30 is about 45 degrees (generally the inclination angle θ being preferably not less than 30 degrees nor more than 60 degrees) are normally implanted about four times in total.

Thereafter, as shown in FIG. 26 (corresponding to claim 12), the resist film 15 is removed. In order to activate the nonactive impurities by the ion implantation, the annealing is performed.

As shown in FIG. 27 (corresponding to FIG. 14), an insulating film 17 is formed substantially over the entire device main surface 1a of the wafer 1 by the CVD method.

Then, as show in FIG. 28 (corresponding to FIG. 16), the insulating film 17 is etched back by anisotropic etching thereby to finally form side walls 17 combined with the offset spacer films 14 on both side walls of each of the gate electrodes 7cp, 7cn, 7mp, and 7mn.

Subsequently, the entire device main surface 1a of the wafer 1 except for the n-channel device region Rcn of the core device region Rc, and the n-channel device region Rmn of the intermediate operating voltage device region Rm is covered with a resist film 18 by the normal lithography. In this state, ion implantation Dnd for doping n-type impurities is performed into the n-channel device region Rcn of the core device region Rc and the n-channel device region Rmn of the intermediate operating voltage device region Rm from the device main surface 1a side of the wafer 1 so as to form the heavily doped n-type source/drain region ND. Thereafter, the resist film 18 is removed.

Then, as shown in FIG. 29 (corresponding to FIG. 16), subsequent heat treatment causes the action of various kinds of impurities doped by the ion implantation to be added up or cancelled each other, whereby the heavily doped n-type source/drain region ND, the n-type extension region NL, and the p-type halo region PH are partitioned relatively clearly from each other.

4. Explanation of Procedure of Correction of Variations in Vth (based on Gate Length or the like) in Manufacturing Method for Semiconductor Integrated Circuit Device According to One Embodiment of Invention (see mainly FIGS. 30, 31, 35, and 36)

The following correction of variations in Vth is performed only for the low operating voltage device system, that is, the first CMIS integrated circuit 101 (whose operating voltage is, for example, in a range of about 1 to 1.2 volts, and which is hereinafter referred to as a "core device system"). This is because the low operating voltage device system has large variations in electric characteristics, such as the Vth or the like, due to fluctuations in process parameter as compared to the intermediate operating voltage device system or the like. Further, only the low operating voltage device system has the process of halo implantation after forming the offset spacer insulating film, and thus other systems except for the low operating voltage device system cannot effectively use information about thickness of the offset spacer insulating film. The reason why the correction is performed in the halo implantation is as follows. That is, the halo implantation is individually performed in each of the low operating voltage device system and the intermediate operating voltage device system, unlike the heavily doped source/drain implantation commonly performed up to the intermediate operating voltage device system or the like. This enables delicate adjustment of the halo implantation for each system (which does not cause trade-off between the respective systems). The same goes for the section 5 described.

Figure 30:
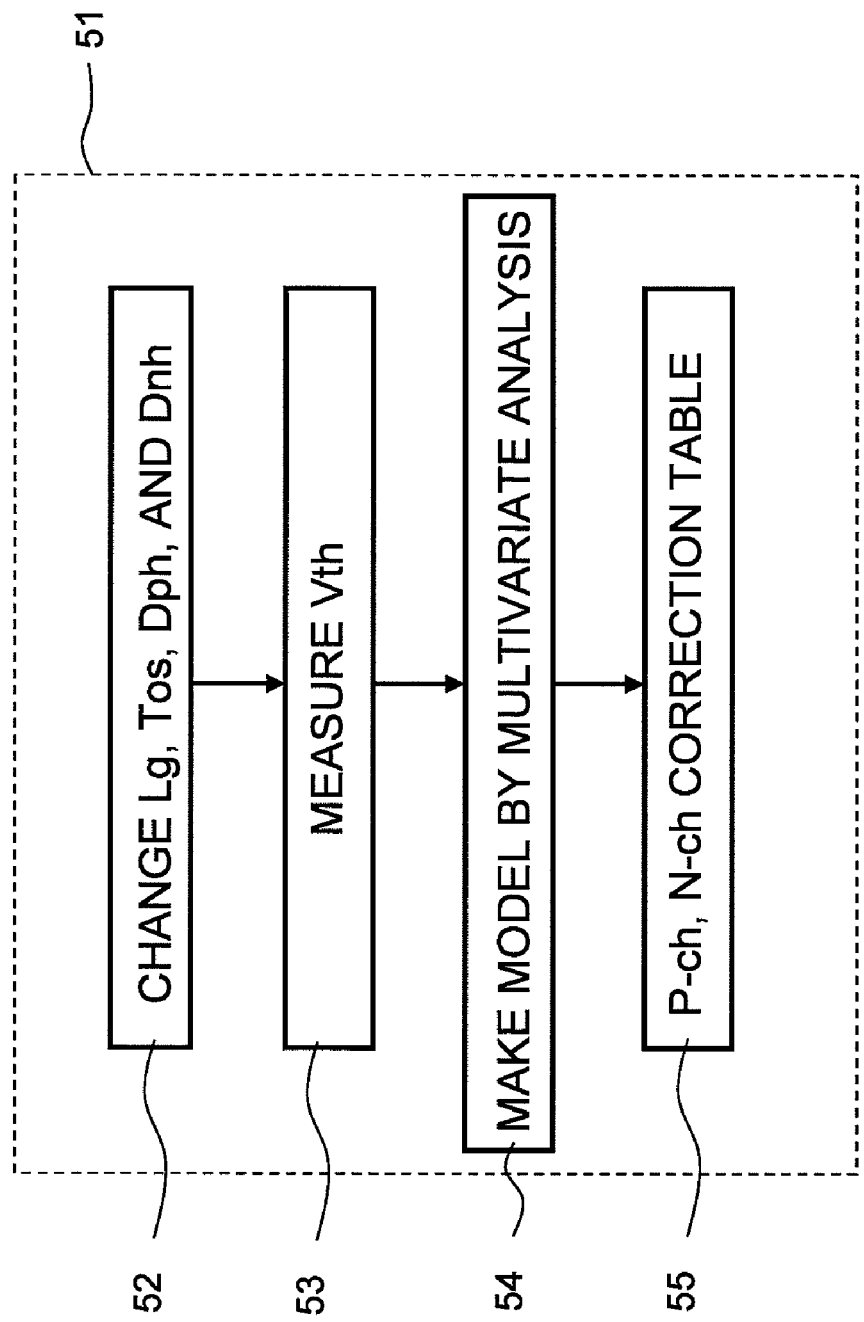
FIG. 30 is a process block flow diagram explaining a preparation step for correction of variations in Vth (based on a gate length or the like) in the manufacturing method for the semiconductor integrated circuit device according to the embodiment of the present application.
Figure 31:
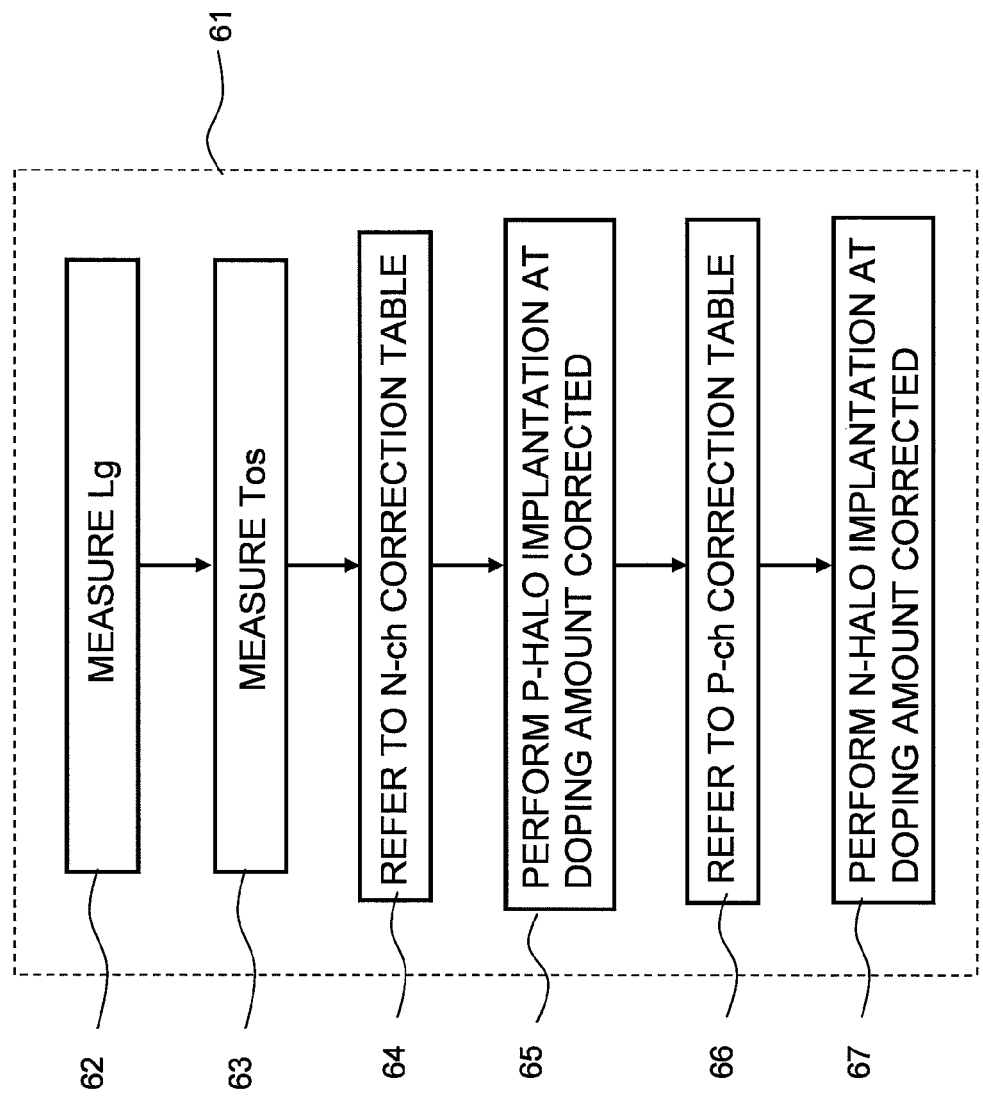
FIG. 31 is a process block flow diagram showing the procedure for correction of variations in Vth (based on the gate length or the like) in the manufacturing method for the semiconductor integrated circuit device according to the embodiment of the present application.

FIG. 30 is a process block flow diagram explaining a preparation step for correction of variations in Vth (based on the gate length or the like) in the manufacturing method for the semiconductor integrated circuit device according to the embodiment of the present application. FIG. 31 is a process block flow diagram showing the procedure for correction of variations in Vth (based on the gate length or the like) in the manufacturing method for the semiconductor integrated circuit device according to the embodiment of the present application. FIG. 35 shows an example of a correction table (for the n-channel MISFET) used for correction (based on the gate length or the like) of variations in Vth in the manufacturing method for the semiconductor integrated circuit device according to the embodiment of the present application.) FIG. 36 shows an example of a correction table (for the p-channel MISFET) to be used for correction (based on the gate length or the like) of variations in Vth in the manufacturing method for the semiconductor integrated circuit device according to the embodiment of the present application. The unit of dose amount in these tables is $10^{13}$ cm$^{-2}$.

Based on these tables, the procedure for the correction of variations in Vth (based on the gate length or the like) in the manufacturing method for the semiconductor integrated circuit device in the embodiment will be described below.

Now, a preparation procedure 51 for correction of variations in Vth will be described below based on FIG. 30. First, in the processes described in the above sections 2 and 3, data about changes in gate length Lg, offset spacer thickness Tos (measurement value, that is, thickness in forming the offset spacer film), a p-halo implantation dose amount Dph, and an n-halo implantation dose amount Dnh is accumulated (process parameter variation data accumulation step 52). Data about Vths measured on the above conditions is accumulated (Vth variation data accumulation step 53). Based on such data, a model between a Vth variation factor process parameter group and fluctuations in Vth is made by multivariate analysis (statistical method) (variation model making step 54). Specifically, correction tables for numerically determining a relationship among each of the p-halo implantation dose amount Dph and the n-halo implantation dose amount Dnh, the gate length Lg (completed value), and the offset spacer thickness Tos (completed value), that is, an n-channel FET correction table (see FIG. 35) and a p-channel FET correction table (see FIG. 36) are made.

Now, the procedure of feed-forward correction 61 of actual process variations will be described based on FIG. 31. As shown in FIG. 31, the gate length Lg and the offset spacer thickness Tos of a product of interest to be subjected to the feed-forward correction when actually manufacturing the product device are measured in the processes described in the sections 2 and 3. The measurement is performed, for example, in units of wafer. Specifically, the gate length Lg is measured by the measurement SEM or the like at the time of completion of etching of the gate electrode as shown in FIG. 8. The value is a gate length Lg (measurement value). There is an offset between this length and a gate length Lg in completion of the device (completed value). By taking into consideration a correction value therefor (the fact that, for example, when the target value of the gate length Lg in completion of etching the gate electrode is 72 nm, the gate length Lg in completion of the device is about 55 nm), the converted gate length Lg (completed value) of the product of interest to be corrected is obtained (in a Lg measurement step 62 shown in FIG. 31). Then, the thickness Tos of the flatten part of the offset spacer film is measured by an optical method, such as an ellipsometer or the like, in forming the offset spacer film 14 (directly after forming the film) as shown in FIG. 23 (FIG. 11) and before the etching back as shown in FIG. 24. The value is an offset spacer thickness Tos (measurement value), which substantially corresponds to an offset spacer thickness Tos (completed value) after the etching back, and can be used as the offset spacer thickness Tos (completed value) as it is (in a Tos measurement step shown in FIG. 31). Then, a p-halo implantation dose amount Dph corresponding to the obtained gate length Lg (completed value) and the offset spacer thickness Tos (completed value) is determined with reference to the n-channel FET correction table shown in FIG. 35 (in an n-channel FET correction table referring step 64 shown in FIG. 31). Based on the dose amount determined, p-halo implantation Dcph is performed as shown in FIGS. 12 and 25 (in a p-halo implantation step 65 at the dose amount corrected as shown in FIG. 31). Then, likewise, an n-halo implantation dose amount Dnh corresponding to the obtained gate length Lg (completed value) and the offset spacer thickness Tos (completed value) is determined with reference to the p-channel FET correction table shown in FIG. 36 (p-channel FET correction table referring step 66 shown in FIG. 31). Based on the dose amount determined, n-halo implantation Dcnh is performed as shown in FIG. 13 (n-halo implantation step 67 at the dose amount corrected as shown in FIG. 31).

5. Explanation of Procedure of Correction of Variations in Vth (Based on Gate Insulating Film Thickness or the like) in Manufacturing Method for Semiconductor Integrated Circuit Device according to One Embodiment of Present Application (see mainly FIGS. 32 and 33)

In the following, the correction of variations in Vth is performed only for the low operating voltage device system, that is, the first CMIS integrated circuit 101 (whose operating voltage is, for example, about 1 to 1.2 volts, and which is hereinafter referred to as a "core device system") by way of example. This method, however, can also be apparently applied to the intermediate operating voltage device system, if necessary. (In this example, since the halo implantation is not performed in the high operating voltage device system, this method cannot be applied, but can be also applied when the halo implantation is performed in the high operating voltage device system.) This is because the halo implantation before forming the offset spacer film can be applied to a device system, unlike the example described in the section 4.

Figure 32:
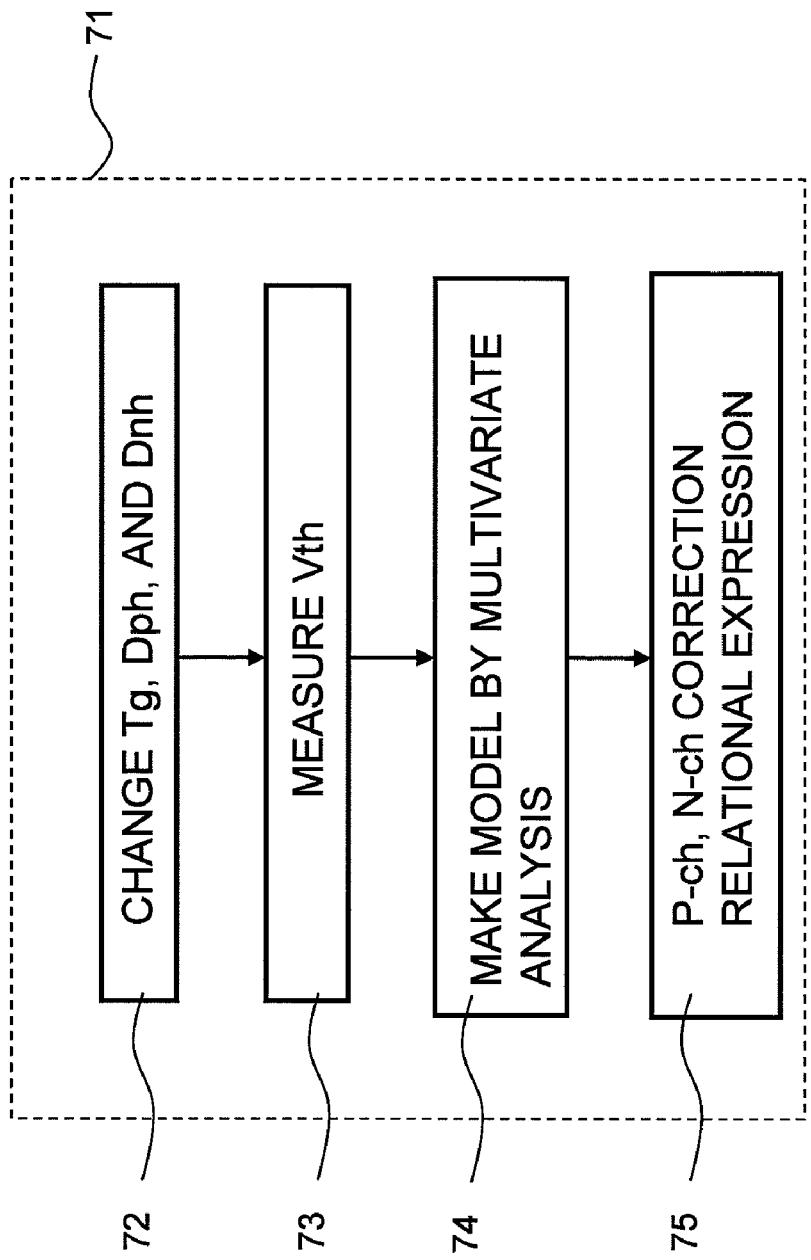
FIG. 32 is a process block flow diagram explaining a preparation step for correction of variations in Vth (based on the thickness of a gate insulating film or the like) in the manufacturing method for the semiconductor integrated circuit device according to the embodiment of the present application.
Figure 33:
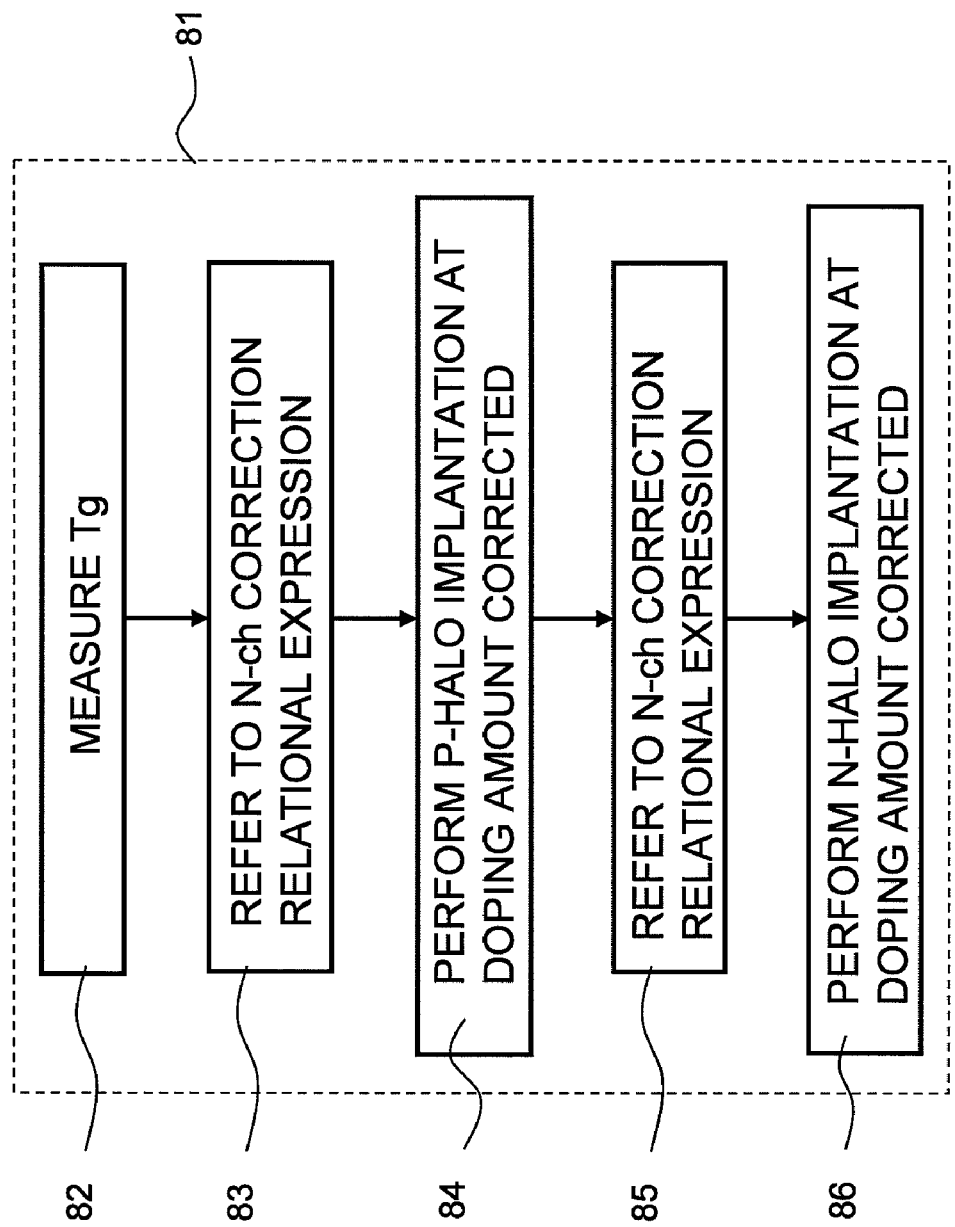
FIG. 33 is a process block flow diagram showing a procedure for correction of variations in Vth (based on the thickness of a gate insulating film or the like) in the manufacturing method for the semiconductor integrated circuit device according to the embodiment of the present application.

FIG. 32 is a process block flow diagram explaining a preparation step for correction of variations in Vth (based on the thickness of the gate insulating film or the like) in the manufacturing method for the semiconductor integrated circuit device according to the embodiment of the present application. FIG. 33 is a process block flow diagram showing the procedure for correction of variations in Vth (based on the thickness of the gate insulating film or the like) in the manufacturing method for the semiconductor integrated circuit device according to the embodiment of the present application. Based on the above description, the procedure for correction of variations in Vth (based on the thickness of the gate insulating film or the like) in the manufacturing method for the semiconductor integrated circuit device according to the embodiment will be described below.

Now, a preparation procedure 71 for correction of variations in Vth will be described below based on FIG. 32. First, in the processes described in the above sections 2 and 3, data about changes in gate insulating film thickness Tg (measured value, that is, the thickness after the azotizing process as shown in FIG. 5), the p-halo implantation doze amount Dph, and n-halo implantation dose amount Dnh is accumulated (process parameter variation data accumulation step 72). Data about Vths measured on the above conditions is accumulated (Vth variation data accumulation step 73). Based on such data, a model between a Vth variation factor process parameter group and fluctuations in Vth is made by multivariate analysis (statistical method) or multivariate regression analysis or the like (variation model making step 74). Specifically, a relational expression for numerically determining the relationship between each of the p-halo implantation dose amount Dph and the n-halo implantation dose amount Dnh, and the gate insulating film thickness Tg, that is, a regression line or the like is made (in some cases, a numeral value table or a regression curved line) (in p-channel and n-channel correction relational expression obtaining step 75).

Now, the procedure for feed-forward correction 81 of the actual process variations will be described below based on FIG. 33. As shown in FIG. 33, a gate insulating thickness Tg is measured for a product of interest to be subjected to the feed-forward correction in actually manufacturing the product device in the processes described in the sections 2 and 3. The measurement is performed, for example, in units of wafer. Specially, the thickness Tg of the gate insulating film is measured by the optical method, such as the ellipsometer or the like upon completion of annealing the gate insulating film 10 azotized as shown in FIG. 5. The value is a gate insulating thickness Tg (measurement value), which is substantially equal to a gate insulating film thickness Tg (completed value) in completion of the device, and thus can be used as it is (in a Tg measurement step 82 shown in FIG. 33). Then, a p-halo implantation dose amount Dph corresponding to the obtained gate insulating film thickness Tg (completed value) is determined with reference to the n-channel FET correction relational expression (n-channel FET correction relational expression referring step 83 shown in FIG. 33). Based on the dose amount determined, p-halo implantation Dcph is performed as shown in FIGS. 12 and 25 (in a p-halo implantation step 84 at the doping amount corrected as shown in FIG. 33). Then, likewise, an n-halo implantation dose amount Dnh corresponding to the obtained gate insulating thickness Tg (completion value) is determined with reference to the p-channel FET correction relational expression shown in FIG. 36 (in a p-channel FET correction relational expression referring step 85 shown in FIG. 33). Based on the dose amount determined, n-halo implantation Dcnh is performed as shown in FIG. 13 (n-halo implantation step 86 at the doping amount corrected as shown in FIG. 33).

6. Summary

The invention made by the inventors has been specifically described above based on the embodiments disclosed herein, but the invention is not limited thereto. Although the exemplary embodiments of the invention have been described in detail, it will be understood by those skilled in the art that the invention is not limited thereto, and that various modifications can be made therein without departing from the spirit and scope of the invention.

For example, although in this embodiment, a copper embedded wiring in the back end process has been described by way of example, a normal wiring structure made of aluminum wiring material may be used. Although in the embodiments the Tos (target value) is a fixed one, a target value may be changed in such a manner that the Vth approaches the target value so as to facilitate correction in the following halo implantation. Note that in this case, the conditions for the multivariate analysis and the correction in the halo implantation can be complicated. Although in the above embodiments the p-type single crystal silicon wafer is used as raw material and the semiconductor integrated circuit device is formed over the wafer by way of example, an n-type single crystal silicon wafer, another epitaxial wafer, or a SOI wafer may be used if necessary. In the above embodiments, the length or thickness is measured by the SEM or ellipsometer in the main part of the above description, but an electron optical method, such as a transmission electron microscopy (TEM) or the like, a mechanical method, such as an atomic force microscopy (AFM) or the like, or an optical method, such as a scatterometory or the like may be apparently used for the measurement.

What is claimed is:

1. A manufacturing method for a semiconductor integrated circuit device, the semiconductor integrated circuit device comprising:

(x1) a semiconductor substrate having a first main surface;

(x2) a first CMIS integrated circuit provided in a chip region of the first main surface of the semiconductor substrate, and having a first operating voltage;

(x3) a first group of n-channel MISFETs provided in the first CMIS integrated circuit; and (x4) a first group of p-channel MISFETs provided in the first CMIS integrated circuit, the method comprising the steps of:

(a) forming respective gate electrodes for the first group of n-channel MISFETs and the first group of p-channel MISFETs over the first main surface of the semiconductor substrate;

(b) measuring a gate length corresponding to the gate electrode over the first main surface of the semiconductor substrate;

(c) forming a first insulating film serving as an offset spacer insulating film, over the first main surface of the semiconductor substrate including an upper surface and both sides of the gate electrode;

(d) applying anisotropic dry etching to the first insulating film formed so as to leave the offset spacer insulating film at both sides of the gate electrode;

(e) measuring a thickness of the first insulating film corresponding to a thickness of the offset spacer insulating film, over the first main surface of the semiconductor substrate;

(f) performing ion implantation for forming a p-halo region made of p-type impurities, into the first group of n-channel MISFETs according to a dose amount defined in response to the gate length and the thickness measured; and (g) performing ion implantation for forming an n-halo region made of n-type impurities into the first group of p-channel MISFETs according to the dose amount defined in response to the gate length and the thickness measured.

2. The manufacturing method for the semiconductor integrated circuit device according to claim 1, wherein the semiconductor integrated circuit device further comprises:

(x5) a second CMIS integrated circuit provided in the chip region of the first main surface of the semiconductor substrate, and having a second operating voltage higher than the first operating voltage.

3. The manufacturing method for the semiconductor integrated circuit device according to claim 1, the semiconductor integrate circuit device further comprising:

(x5) a second CMIS integrated circuit provided in the chip region of the first main surface of the semiconductor substrate, and having a second operating voltage higher than the first operating voltage; and (x6) a third CMIS integrated circuit provided in the chip region of the first main surface of the semiconductor substrate, and having a third operating voltage higher than the second operating voltage.

4. The manufacturing method for the semiconductor integrated circuit device according to claim 1, wherein the steps (f) and (g) are performed after the step (c).

5. The manufacturing method for the semiconductor integrated circuit device according to claim 1, wherein the step (e) is performed after the step (c) and before the step (d).

6. The manufacturing method for the semiconductor integrated circuit device according to claim 1, wherein the step (b) is performed after the step (a) and before the step (c).

7. The manufacturing method for the semiconductor integrated circuit device according to claim 1, the semiconductor integrated circuit device further comprising:

(x5) a second CMIS integrated circuit provided in the chip region of the first main surface of the semiconductor substrate, and having a second operating voltage higher than the first operating voltage, wherein the halo ion implantation into the second CMIS integrated circuit is performed before the step (c).

8. The manufacturing method for the semiconductor integrated circuit device according to claim 1, the semiconductor integrated circuit device further comprising:

(x5) a second CMIS integrated circuit provided in the chip region of the first main surface of the semiconductor substrate, and having a second operating voltage higher than the first operating voltage, wherein the second CMIS integrated circuit includes a second group of n-channel MISFETs, the second group of n-channel MISFETs including a lower-level group of n-channel MISFETs with different threshold voltages.

9. The manufacturing method for the semiconductor integrated circuit device according to claim 1, the method further comprising the steps of:

(h) after the step (g), forming side wall spacer insulating films at both sides of the offset spacer insulating films located at both sides of the gate electrode;

(i) after the step (g), implanting p-type high-concentration impurities for forming a heavily doped source/drain region, into the first group of p-channel MISFETs; and (j) after the step (g), implanting n-type high-concentration impurities for forming the heavily doped source/drain region, into the first group of n-channel MISFETs.

10. The manufacturing method for the semiconductor integrated circuit device according to claim 1, the semiconductor integrated circuit device further comprising:

(x5) a second CMIS integrated circuit provided in the chip region of the first main surface of the semiconductor substrate, and having a second operating voltage higher than the first operating voltage, the method further comprising the steps of:

(h) after the step (g), forming a side wall spacer insulating film at both sides of the offset spacer insulating films located at both sides of the gate electrode;

(i) after the step (g), implanting p-type high-concentration impurities for forming a heavily doped source/drain region, into the first group of p-channel MISFETs; and (j) after the step (g), implanting n-type high-concentration impurities for forming the heavily doped source/drain region, into the first group of n-channel MISFETs, wherein, in implanting the p-type high-concentration impurities and the n-type high-concentration impurities, the implantation of the p-type high-concentration impurities and of the n-type high-concentration impurities is performed to respectively form the heavily doped source/drain regions for the p-channel MISFET group and the n-channel MISFET group of the second CMIS integrated circuit.

11. The manufacturing method for the semiconductor integrated circuit device according to claim 1, the semiconductor integrated circuit device further comprising:

(x5) a second CMIS integrated circuit provided in the chip region of the first main surface of the semiconductor substrate, and having a second operating voltage higher than the first operating voltage; and (x6) a third CMIS integrated circuit provided in the chip region of the first main surface of the semiconductor substrate, and having a third operating voltage higher than the second operating voltage, the method further comprising the steps of:

(h) after the step (g), forming side wall spacer insulating films at both sides of the offset spacer insulating films located at both sides of the gate electrode, (i) after the step (g), implanting p-type high-concentration impurities for forming a heavily doped source/drain region, into the first group of p-channel MISFETs; and (j) after the above step (g), implanting n-type high-concentration impurities for forming the heavily doped source/drain region, into the first group of n-channel MISFETs, wherein, in implanting the p-type high-concentration impurities and the n-type high-concentration impurities, the implantation of the p-type high-concentration impurities and of the n-type high-concentration impurities is performed to respectively form the heavily doped source/drain regions for the p-channel MISFET group and the n-channel MISFET group of each of the second and third CMIS integrated circuits.

12. The manufacturing method for the semiconductor integrated circuit device according to claim 1, wherein the first group of n-channel MISFETs includes a lower-level group of n-channel MISFETs with different threshold voltages.

13. A manufacturing method for a semiconductor integrated circuit device, the semiconductor integrated circuit device comprising:

(x1) a semiconductor substrate having a first main surface;

(x2) a first CMIS integrated circuit provided in a chip region of the first main surface of the semiconductor substrate, and having a first operating voltage;

(x3) a first group of n-channel MISFETs provided in the first CMIS integrated circuit; and (x4) a first group of p-channel MISFETs provided in the first CMIS integrated circuit, the method comprising the steps of:

(a) forming a gate insulating film over the first main surface of the semiconductor substrate;

(b) measuring a thickness of the gate insulating film over the first main surface of the semiconductor substrate;

(c) forming a gate electrode for each of the first group of n-channel MISFETs and the first group of p-channel MISFETs over the gate insulating film;

(d) forming a first insulating film serving as an offset spacer insulating film, over the first main surface of the semiconductor substrate including an upper surface and both sides of the gate electrode;

(e) applying an isotropic etching to the first insulating film formed, such that the offset spacer insulating films are left over both sides of the gate electrode;

(f) performing ion implantation for forming a p-halo region made of p-type impurities into the first group of n-channel MISFETs according to a dose amount defined in response to the measured thickness of the gate insulating film; and (g) performing ion implantation for forming an n-halo region made of n-type impurities into the first group of p-channel MISFETs according to a dose amount defined in response to the measured thickness of the gate insulating film.

14. The manufacturing method for the semiconductor integrated circuit device according to claim 13, the semiconductor integrated circuit device further comprising:

(x5) a second CMIS integrated circuit provided in the chip region of the first main surface of the semiconductor substrate, and having a second operating voltage higher than the first operating voltage.

15. The manufacturing method for a semiconductor integrated circuit device according to claim 13, the semiconductor integrated circuit device further comprising:

(x5) a second CMIS integrated circuit provided in the chip region of the first main surface of the semiconductor substrate, and having a second operating voltage higher than the first operating voltage; and (x6) a third CMIS integrated circuit provided in the chip region of the first main surface of the semiconductor substrate, and having a third operating voltage higher than the second operating voltage.

16. The manufacturing method for a semiconductor integrated circuit device according to claim 13, the semiconductor integrated circuit device further includes:

(x5) a second CMIS integrated circuit provided in the chip region of the first main surface of the semiconductor substrate, and having a second operating voltage higher than the first operating voltage, the method further comprising the steps of:

(h) after the step (g), forming side wall spacer insulating films at both sides of the offset spacer insulating films located at both sides of the gate electrode, (i) after the step (g), implanting p-type high-concentration impurities for forming a heavily doped source/drain region, into the first group of p-channel MISFETs; and (j) after the above step (g), implanting n-type high-concentration impurities for forming the heavily doped source/drain region, into the first group of n-channel MISFETs.

17. The manufacturing method for the semiconductor integrated circuit device according to claim 13, the semiconductor integrated circuit device further comprising:

(x5) a second CMIS integrated circuit provided in the chip region of the first main surface of the semiconductor substrate, and having a second operating voltage higher than the first operating voltage, the method further including the steps of:

(h) after the step (g), forming side wall spacer insulating films at both sides of the offset spacer insulating films located at both sides of the gate electrode, (i) after the step (g), implanting p-type high-concentration impurities for forming a heavily doped source/drain region, into the first group of p-channel MISFETs; and (j) after the above step (g), implanting n-type high-concentration impurities for forming the heavily doped source/drain region, into the first group of n-channel MISFETs, wherein, in implanting the p-type high-concentration impurities and the n-type high-concentration impurities, the implantation of the p-type high-concentration impurities and of the n-type high-concentration impurities is performed to respectively form the heavily doped source/drain regions for the p-channel MISFET group and the n-channel MISFET group of the second CMIS integrated circuit.

18. The manufacturing method for the semiconductor integrated circuit device according to claim 13, the semiconductor integrated circuit device further comprising:

(x5) a second CMIS integrated circuit provided in the chip region of the first main surface of the semiconductor substrate, and having a second operating voltage higher than the first operating voltage; and (x6) a third CMIS integrated circuit provided in the chip region of the first main surface of the semiconductor substrate, and having a third operating voltage higher than the second operating voltage, the method further comprising the steps of:

(h) after the step (g), forming side wall spacer insulating films at both sides of the offset spacer insulating films located at both sides of the gate electrode, (i) after the step (g), implanting p-type high-concentration impurities for forming a heavily doped source/drain region, into the first group of p-channel MISFETs; and (j) after the step (g), implanting n-type high-concentration impurities for forming the heavily doped source/drain region, into the first group of n-channel MISFETs, wherein, in implanting the p-type high-concentration impurities and the n-type high-concentration impurities, the implantation of the p-type high-concentration impurities and of the n-type high-concentration impurities is performed to respectively form the heavily doped source/drain regions for the p-channel MISFET group and the n-channel MISFET group of each of the second and third CMIS integrated circuits.

19. The manufacturing method for a semiconductor integrated circuit device according to claim 13, wherein the measurement of the thickness of the gate insulating film is performed after the step (a) and before forming the gate electrode film.

20. The manufacturing method for a semiconductor integrated circuit device according to claim 13, wherein the first group of n-channel MISFETs includes a lower-level group of n-channel MISFETs with different threshold voltages.

* * * * *